United States Patent
Park et al.

(10) Patent No.: US 9,093,669 B2
(45) Date of Patent: Jul. 28, 2015

(54) TRANSPARENT ORGANIC LIGHT EMITTING DISPLAY DEVICE AND METHOD FOR MANUFACTURING THE SAME

(71) Applicant: LG Display Co., Ltd., Seoul (KR)

(72) Inventors: SungHee Park, Goyang-si (KR); Binn Kim, Seoul (KR); JongMoo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/102,194

(22) Filed: Dec. 10, 2013

(65) Prior Publication Data

US 2014/0183479 A1 Jul. 3, 2014

(30) Foreign Application Priority Data

Dec. 28, 2012 (KR) .......................... 10-2012-0155929

(51) Int. Cl.
*H01L 27/15* (2006.01)
*H01L 31/12* (2006.01)
*H01L 33/00* (2010.01)
*H01L 51/56* (2006.01)
*H01L 27/32* (2006.01)

(52) U.S. Cl.
CPC .............. *H01L 51/56* (2013.01); *H01L 27/326* (2013.01); *H01L 27/3216* (2013.01); *H01L 27/3218* (2013.01); *H01L 27/3246* (2013.01); *H01L 27/3276* (2013.01); *H01L 2251/5323* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

2006/0017375 A1 1/2006 Noguchi et al.
2012/0228603 A1* 9/2012 Nakamura ....................... 257/40

FOREIGN PATENT DOCUMENTS

| JP | 2008-288075 A | 11/2008 |
|---|---|---|
| KR | 10-2004-0025449 A | 3/2004 |
| KR | 10-2011-0004170 A | 1/2011 |
| KR | 10-2011-0104269 A | 9/2011 |

OTHER PUBLICATIONS

PCT International Search Report for PCT/KR2013/012077, Apr. 10, 2013, 3 Pages.

* cited by examiner

*Primary Examiner* — Hoai V Pham
(74) *Attorney, Agent, or Firm* — Fenwick & West LLP

(57) ABSTRACT

Provided are an organic light emitting display device and a method for manufacturing the same. The organic light emitting display device includes a plurality of pixels, each including a set of sub pixels. Each of the sub pixels has an emissive area for emitting light and a transmissive area for passing the external light. At least two sub pixels are symmetrically arranged on each side of an auxiliary electrode, and share the auxiliary electrode.

20 Claims, 22 Drawing Sheets

TRANSPARENT ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2012-0155929 filed on Dec. 28, 2012, in the Korean Intellectual Property Office, the disclosure of which is incorporated herein by reference.

BACKGROUND

1. Field of the Invention

The embodiments herein relate to a transparent organic light emitting display device and a method for manufacturing the same, and more particularly, to a transparent organic light emitting display device with an auxiliary electrode and pixel/sub pixel layouts for enhancing the image quality without sacrificing the luminance and transparency of the display device.

2. Description of the Related Art

An organic light emitting diode (OLED) display device, as a self-emission display device, does not require a separate light source as a liquid crystal display (LCD). Further, the OLED display device is more power efficient and has better response speed, viewing angle and contrast ratio, making it a promising next-generation display device.

The OLED display device includes a plurality of OLED elements that can be classified into one of a top emission type, a bottom emission type and a dual emission type OLED element depending on the direction of emitted light exiting the OLED element. For example, an OLED element can be classified as a bottom emission mode OLED element if the light emitted from the OLED element passes through a transparent or a semi-transparent bottom electrode (e.g., a node) and substrate on which the OLED element was manufactured. An OLED element can be classified as a top emission type OLED element if the light emitted from the OLED element exits through a transparent or a semi-transparent top electrode (e.g., cathode). Also, an OLED element can be classified as a dual emission mode OLED element if the light emitted from the OLED element exits through both the top and bottom electrodes to emit light on both sides of the OLED element.

In an organic light emitting display device employing top emission type organic light emitting element, an electrode having a transparent characteristic or an electrode having a semi-transmissive characteristic is used as a cathode so that the light emitted from an organic emission layer exits upward through the cathode. To obtain sufficient light transmittance rate through the cathode, the cathode needs to be formed very thin. The decrease in thickness of the cathode, however, increases its electrical resistance. The increased electrical resistance, in turn, causes voltage drop in some parts of the organic light emitting display device creating non-uniform luminance throughout the screen. The voltage drop phenomenon intensifies as size of the display device increases. In this specification, the term "voltage drop" refers to the phenomenon in which a potential difference between an anode and the cathode of the organic light emitting element decreases.

To solve the voltage drop problem, an auxiliary electrode can be used in the organic light emitting display device to provide a common voltage at the location where the voltage drop is expected to occur. The auxiliary electrode, however, needs to have sufficient size and thickness to serve its purpose. The amount of space used by the auxiliary electrode in the organic light emitting display device reduces the available space for other components of the organic light emitting display device. The number of auxiliary electrodes employed in an organic light emitting display device makes it even harder to manage the space within the organic light emitting display device, which is often a critical aspect in most modern display devices. This is especially true for transparent organic light emitting display device, because placing the auxiliary electrode(s) in the pixel area reduces the size of the emissive area and/or the transmissive area, resulting in poor luminance and/or poor transparency through the display device.

Accordingly, there remains a need for a transparent organic light emitting display device with improved pixel layouts that can reduce the voltage drop problem without sacrificing the performance and the transparency of the device.

SUMMARY

Accordingly, an aspect of the embodiments herein relate to a transparent organic light emitting display device with an improved arrangement of auxiliary electrodes and sub pixels. The organic light emitting display device includes a plurality of sub pixels. Each of the sub pixels include a first area associated with a first function of the sub-pixel and a second area associated with a second function of the sub-pixel. The transparent organic light emitting display device also includes a plurality of auxiliary electrodes electrically connected to at least some of the plurality of sub pixels via a conductive element where said at least some of the plurality of sub pixels includes a first sub pixel and a second sub pixel. In one embodiment, an auxiliary electrode is disposed between the first sub-pixel and the second sub-pixel such that the auxiliary electrode is closer to a first area of the first sub-pixel and a first area of the second sub-pixel than a second area of the first sub-pixel and a second area of the second sub-pixel.

In one aspect, the present invention relates to a transparent organic light emitting display device, comprising a plurality of sub pixels, each of the sub pixels including an emissive area and a transmissive area. The transparent organic light emitting display device further comprises a plurality of auxiliary electrodes electrically connected to conductive element of at least some of the plurality of sub pixels where said at least some of the plurality of sub pixels includes a first sub pixel and a second sub pixel that are symmetrically arranged to each of her relative to the auxiliary electrode.

In one aspect, the embodiments herein relates to an improved transparent organic light emitting display device. The organic light emitting display device includes an auxiliary electrode including a first side and a second side, the auxiliary electrode extending in a first direction. The display device also includes a first pixel including a first plurality of sub-pixels disposed on the first side of the auxiliary electrode and a second pixel including a second plurality of sub-pixels disposed on the second side of the auxiliary electrode. At least one of the first plurality of sub-pixels of the first pixel is connected to the auxiliary electrode and at least one of the second plurality of sub-pixels of the second pixel is connected to the auxiliary electrode. Furthermore, at least one of the first plurality of sub-pixels of the first pixel is not connected to the auxiliary electrode and at least one of the second plurality of sub-pixels of the second pixel is not connected to the auxiliary electrode.

In one aspect, the embodiments herein relate to a method for manufacturing a transparent organic light emitting display device, comprising forming a plurality of auxiliary electrodes and a plurality of anodes such that at least one auxiliary electrode is formed between an anode of a first sub pixel and an anode of a second sub pixel that are symmetrically formed relative to the auxiliary electrode. The method further comprises forming a first bank and a second bank, in which the first bank is formed between the anode of the first sub pixel and the auxiliary electrode, and the second bank is formed between the anode of the second sub pixel and the auxiliary electrode. An organic emission layer is formed such that the organic emission layer is on the first and second sub pixels. A cathode is formed such that the cathode is in the first and second sub pixels.

Additional features of the invention will be set forth in the description, which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and other advantages of the present invention will be more clearly understood from the following detailed description taken in conjunction with the accompanying drawings.

Figure 1A:
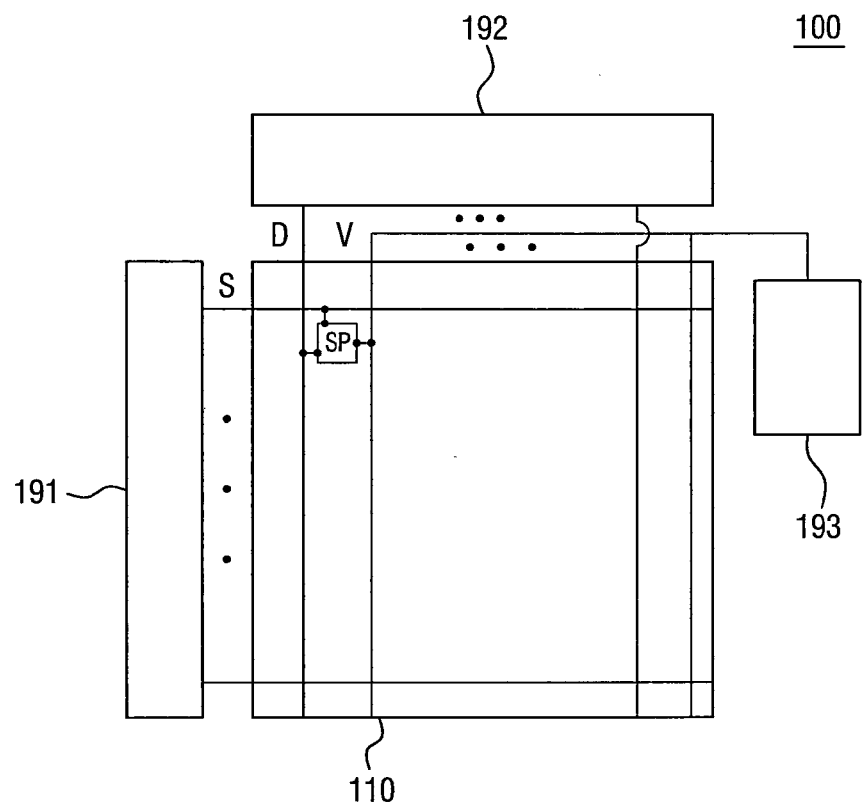
FIG. 1A is a conceptual diagram of an organic light emitting display device.

In the drawings, dimensions of each element are arbitrarily illustrated for convenience of description, and the present invention is not necessarily limited to those illustrated in the drawings.

DETAILED DESCRIPTION

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

In the following description, numerous specific details are set forth, such as particular structures, components, materials, dimensions, processing steps and techniques, in order to provide an understanding of the various embodiments of the present disclosure. In other instances, well-known structures or processing steps have not been described in detail in order to avoid obscuring the present disclosure.

Indicating that elements or layers are "on" other elements or layers in dude both a case in which the corresponding elements are directly above other elements and a case in which the corresponding elements are intervened with other layers or elements. In contrast, when an element is referred to as being "directly on" another element, there are no intervening elements present. It will also be understood that when an element is referred to as being "electrically connected" to another element, it can be directly connected to the other element or connected via some intervening elements may be present therebetween. In contrast, when an element is referred to as being "directly connected" to or "in contact" with another element, it should be understood that there are no intervening elements therebetween.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

In this specification, the term "organic light emitting device", which may be referred to herein after as "the display device", is used as the generic term for the organic light emitting diode (OLED) panel and the display device employing such OLED panel. Generally, there are two different types of an organic light emitting display device, a white OLED type and a RGB OLED type. In the white OLED type, each of the sub pixels of a pixel is configured to emit white light, and a set of color filters is used to filter the white light to generate red, green and blue light at the corresponding sub pixel. The white OLED type may also include a sub pixel configured without a color filter to form a sub pixel for generating white light. In the RGB OLED type, the organic emission layer in each of the sub pixel is configured to emit light of a designated color. For example, a pixel includes a red sub pixel with an organic emission layer that emits red light, a green sub pixel with an organic emission layer that emits green light, and a blue sub pixel with an organic emission layer that emits blue light. To generate white light from the pixel, all three sub pixels needs to emit their designated colored light.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or executed together through an association relationship.

Figure 1B:
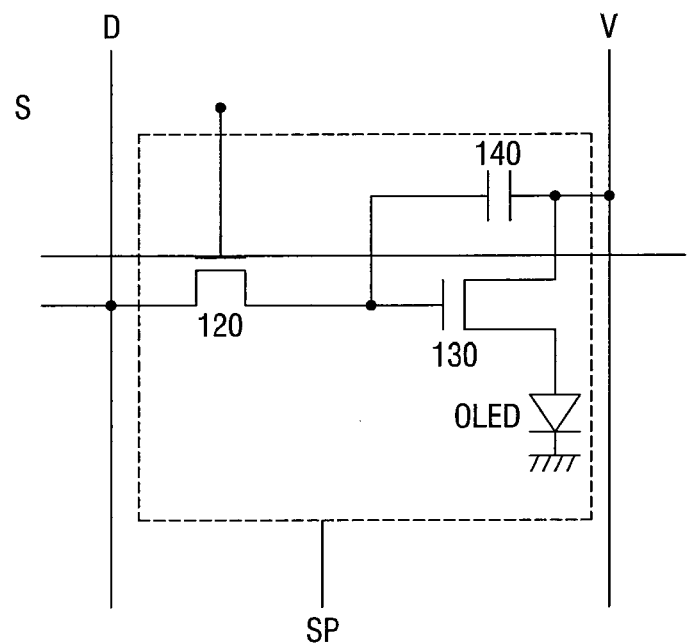
FIG. 1B is an enlarged conceptual diagram for a sub pixel area of FIG. 1A.

Exemplary embodiments of the present application will now be described in greater detail by referring to the following discussion and drawings that accompany the present application. FIG. 1A depicts a conceptual diagram of an exemplary organic light emitting display device, and FIG. 1B depicts an enlarged conceptual diagram for a sub pixel area "SP" shown in FIG. 1A. For convenience of description, FIG. 1A illustrates one sub pixel area SP, but it should be understood that the substrate 110 may include a plurality of sub pixel areas SP, which may be arranged in a matrix form.

Referring to FIGS. 1A and 1B, an organic light emitting display device 100 includes a substrate 110 including a sub pixel area SP, a gate driver 191, a data driver 192, and a power supplying unit 193. The sub pixel area SP includes a first thin film transistor 120, a second thin film transistor 130, and a capacitor 140.

The gate driver 191 may be configured to apply a scan signal to a first thin film transistor 120 through a gate wiring "S", and a data driver 192 and a $V_{dd}$ power wiring "Vdd" may be configured to apply a data signal to the first thin film transistor 120 through a data wiring "D". Also, the power supplying unit 193 may be configured to transfer a current through a $V_{ss}$ power wiring "Vss" to control the second thin film transistor 130. In FIG. 1A, the gate driver 191, the data driver 192, and the power supplying unit 193 are depicted as being positioned outside of the substrate 110, but it should be noted that they can be formed on the substrate 110.

Generally, an organic light emitting display device includes a plurality of pixel areas. Each pixel area includes a plurality of sub pixel areas emitting light of designated colors. For example, each of the plurality of pixel areas may include a red sub pixel area, a green sub pixel area, and a blue sub pixel area, and may further include a white sub pixel area in order to reduce power consumption and improve luminance. In the exemplary sub pixel depicted in FIG. 1B, each sub pixel area SP includes the first thin film transistor 120 as a switching thin film transistor, the second thin film transistor 130 as a driving thin film transistor, and the capacitor 140. However, it should be appreciated that the configuration of the sub pixel is not limited as shown in FIG. 1B, and that the sub pixel circuit can be configured in various other designs employing different number of thin film transistors and capacitors for improving reliability and performance of the organic light emitting display device 100.

Figure 2:
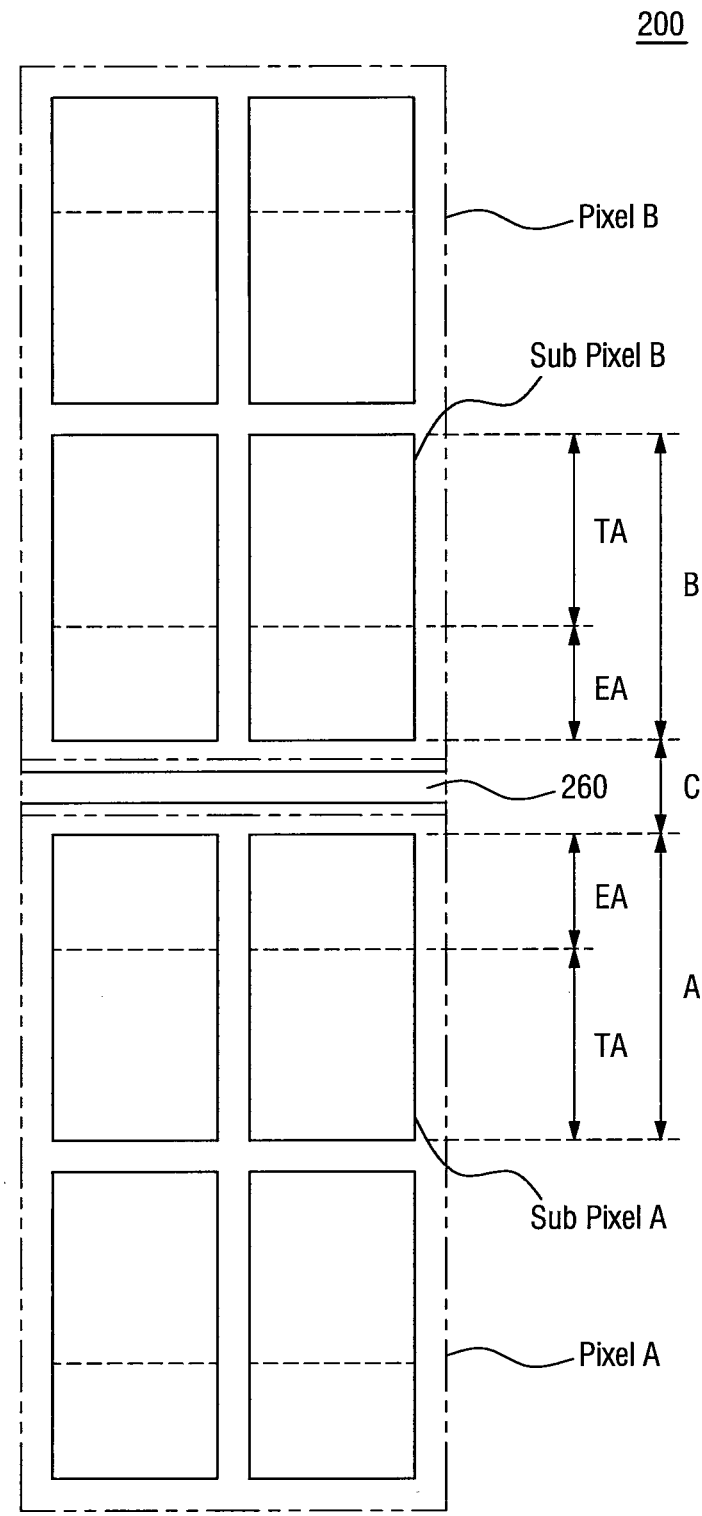
FIG. 2 is a plan view of an exemplary organic light emitting display device according to one embodiment.

Referring to FIG. 2, the organic light emitting display device 200 includes a first sub pixel area A and a second sub pixel area B. In the present disclosure, the term "first sub pixel area A" is used to refer any one sub pixel are a within a pixel area. For instance, the first sub pixel area A can be any one of a red sub pixel area, a green sub pixel area, a blue sub pixel area and a white sub pixel area. The term "second sub pixel area B" is used to refer any one sub pixel area disposed next to the first sub pixel area A. Similar to the first sub pixel area A, the second sub pixel area B can be any one of the red, green, blue and white sub pixel areas. The first sub pixel area A and the second sub pixel area B can be part of a same pixel or they may be part of separate pixels. Further, it should be noted that the terms "pixel area" and "sub pixel area" are used interchangeably with the terms "pixel" and "sub pixel", respectively.

The organic light emitting display device of the present invention is a transparent display device, which allows objects behind the display device can be seen through the display device to its users. To achieve this, at least some part of the display device is configured to have a predetermined light transmittance rate (e.g., 20% or more) so that the user can see through the display device.

In an exemplary embodiment depicted in FIG. 2, each sub pixel includes a light transmissive area for allowing external light to pass through. More specifically, each of the first sub pixel area A and the second sub pixel area B includes an emissive area "EA" (i.e., a first area) and a transmissive area "TA" (i.e., a second area). The emissive area EA may be also be referred to as "an emission part," and the transmissive area TA may be referred to as "a transmission part." Note that in other embodiments, the transmissive area TA is a first area and the emissive area is the second area. The emissive area EA is an area configured to emit light (i.e., a first function) to display an actual image on the organic light emitting display device, and the transmissive area TA is an area configured to transmit external light through the organic light emitting display device (i.e., a second function). Note that in other embodiments, the functionality of the transmissive area TA is a first function and the functionality of the emissive area is a second function. In this setting, the viewer may simultaneously see both the images displayed by the display device as well as the background of the display device.

In the exemplary pixel arrangement shown in FIG. 2, an auxiliary electrode 260 is disposed in the intermediate area C between the first sub pixel area A and the second sub pixel area B, such that the first sub pixel area A and the second sub pixel area B are disposed at the opposite sides of the auxiliary electrode. In one embodiment, the intermediate area is an area that is neither emissive nor transmissive. The first sub pixel area A and the second sub pixel area B are symmetrically disposed relative to the intermediate area C, such that the layouts of the transmissive area TA and the emissive area EA in the first and second sub pixel areas A and B mirror each other.

In the example shown in FIG. 2, the emissive areas EAs of the first and second sub pixel areas A and B are arranged directly adjacent to the auxiliary electrode 260 formed in the intermediate area C, and the transmissive areas T As of the first and second sub pixel areas A and B are arranged away from the auxiliary electrode between the two sub pixel areas. That is, the auxiliary electrode 260 is closer to the emissive areas EA of the first sub pixel area A and the second sub pixel B than the transmissive areas TA of the first sub pixel area A and the second sub pixel B. As such, the arrangement of the emissive area EA and the transmissive areas TA within the first sub pixel mirrors the arrangement of the emissive area EA and the transmissive area TA within the second sub pixel in reference to the auxiliary electrode 260 in the intermediate area C.

In FIG. 2, the size of the emissive area EA is depicted to be smaller than the size of the transmissive area TA, but the sizes of the emissive area and the transmissive area are not limited as such. To improve image display functionality of the display device, the size of the emissive area EA can be increased to have an equal or larger size than the size of the transmissive area TA. Also, the proportion of the transmissive area TA and the emissive area EA in a single sub pixel can be adjusted for more space efficient and higher performance pixel designs. For instance, the size of the TA and/or the EA can be adjusted such that the total size of adjacently disposed transmissive areas of adjacent sub pixels can be equal, or otherwise in a specific proportion, to the size of the emissive area.

FIGS. 3 to 6 are cross-sectional views of various exemplary embodiments of the organic light emitting display device. In FIGS. 3 through 6, an organic light emitting element is disposed in both the first and second sub pixel areas A and B. Since the EA/TA layout of the sub pixel areas A and B mirrors each other, some or all of the elements in the sub pixel areas A and B may be identical. For simpler explanation, only the elements in the sub pixel area A are described in reference to the FIGS. 3 through 6 although the sub pixel area B includes the same elements described below for sub pixel area A.

Figure 3:
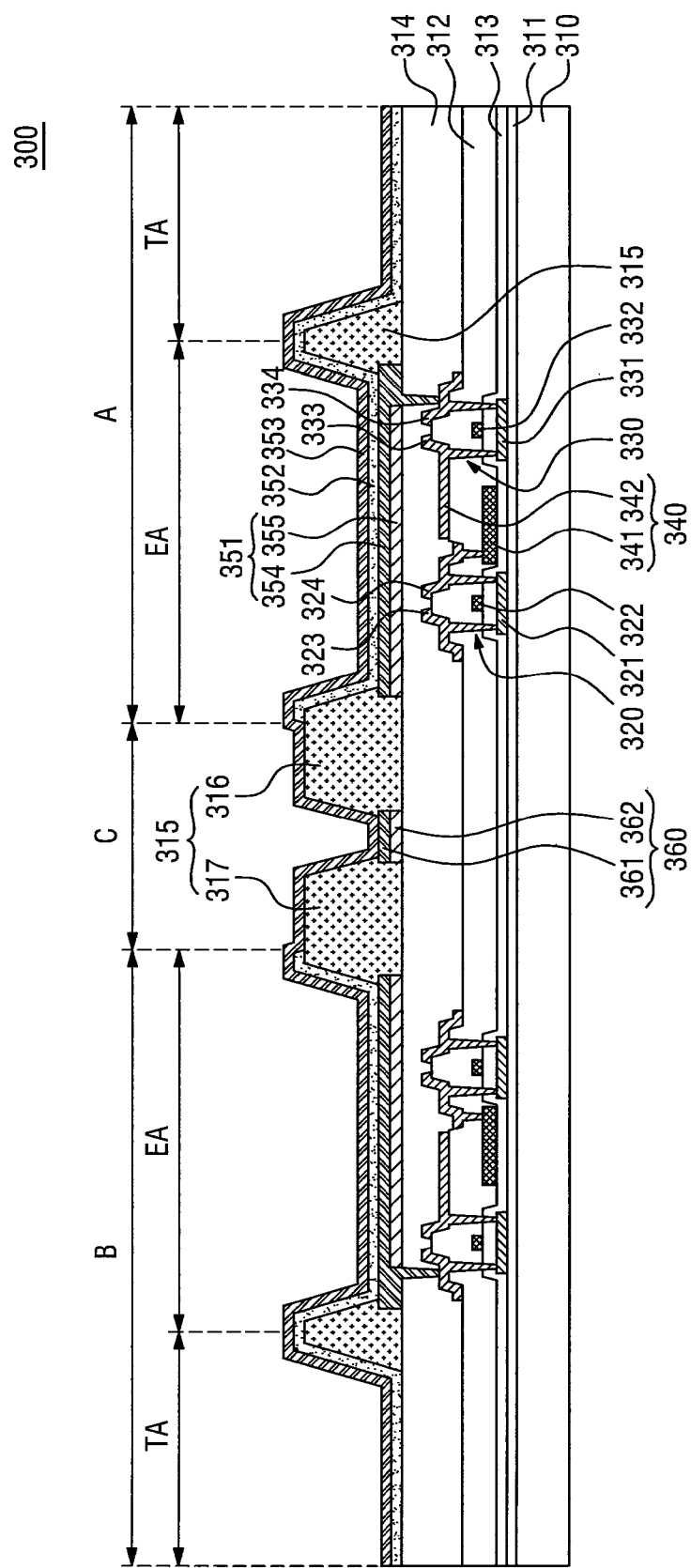
FIGS. 3 to 4 are cross-sectional views of organic light emitting display devices according to various exemplary embodiments of the present disclosure.

A first sub pixel area A, a second sub pixel area B and an intermediate area C are illustrated in the FIG. 3. The thin film transistors (TFTs) 320 and 330, the anode 351 and the organic emission layer 352 are disposed in the first sub pixel area A. The auxiliary electrode 360 is disposed in the intermediate area C, which is between the first sub pixel area A and the second sub pixel area B. The cathode 353 is disposed continuously from the sub pixel area A to the sub pixel area B. Thus, the cathode 353 is common to both the sub pixel area A and sub pixel area B and is one embodiment of a conductive element.

The substrate 310 is a substrate for supporting many elements of the organic light emitting display device 300. The substrate 310 is a support substrate positioned below the organic light emitting display device 300. The substrate 310 may be constituted with an insulating material, and for example, may be made of glass, plastic, or the like, but is not limited thereto, and may be made of various materials.

In some embodiments, the organic light emitting display device may be a flexible display device. A flexible display device refers to an organic light emitting display device with at least some degree of physical flexibility. The term "a flexible display device" may be used as the same meaning as a bendable display device, a rollable display device, an unbreakable display device, a foldable display device, and the likes. In the case where the organic light emitting display device 300 is a flexible organic light emitting display device, the substrate 310 may be made of a flexible insulating material. The organic light emitting display device of the present invention can be a flexible display device. Here, a usable flexible insulating material may include polyetherimide (PEI), polyethylene terephthalate (PET), and the like in addition to polyimide (PI). Since the organic light emitting display device 300 is a transparent organic light emitting display device, the substrate 310 may be made of a transparent insulating material.

A buffer layer 311 is formed on the substrate 310. The buffer layer 311 prevents moisture or impurities from being penetrated through the substrate 310, and planarizes the upper side of the substrate 310. The configuration of the buffer layer 311 can vary according to the type of substrate 310 and/or the type of the TFTs used in the organic light emitting display device 300. For example, when the TFT uses an oxide semiconductor as its active layer, the buffer layer 311 may not be a necessary in the organic light emitting display device 300. In contrast, the buffer layer 311 can be useful when the TFT employs an active layer formed of amorphous or poly-silicon based semiconductor. In cases where the buffer layer 311 is used, the buffer layer 311 may be formed as a silicon oxide layer, a silicon nitride layer, or multiple layers thereof.

As shown in FIG. 3, one or more TFTs and capacitors may be disposed in each of the sub pixel areas A and B. Such TFTs and capacitors may include light reflective materials, and if disposed in the transmissive area TA, the light transmittance rate may be reduced to make it difficult for the users to see through the display device. Accordingly, the first thin film transistor 320, the second thin film transistor 330 and the capacitor 340 may formed in the emissive area EA as illustrated in FIG. 3. Although the TFTs are disposed within the emissive area EA, it should be noted that the TFTs may be disposed in the transmissive area TA or any other areas so long as sufficient light transmittance rate at the transmissive area can be maintained.

The first TFT 320 may be a switching TFT, and the second TFT 330 may be a driving TFT. As such, the first TFT 320 may transfer the data signal from the data line to the gate electrode 332 of the second TFT 330. The amount of current provided to the second TFT 330 from the Vdd power line may be determined by the data signal from the first TFT 320, and the second TFT 330 may control the emission of the organic emission layer 352 by applying the determined current to the anode 351. In the present disclosure, the term "thin film transistor" is used to refer any one of the TFTs described above.

The first and second TFTs 320 and 330, each includes an active layer 321 and 331, respectively. The active layer 321 may include a source area electrically connected with source electrodes 323, a drain area electrically connected with drain electrodes 324, and a channel area between the source area and the drain area. Similarly, the active layer 331 may include a source area electrically connected with source electrodes 333, a drain area electrically connected with drain electrodes 334, and a channel area between the source area and the drain area.

The active layers 321 and 331 may include amorphous silicon, polycrystalline silicon, or one or more of oxide semiconductor materials. The oxide semiconductor materials included in the active layers 321 and 331 may include, indium tin gallium zinc oxide (InSnGaZnO)-based materials which are quaternary metal oxides, indium gallium zinc oxide (InGaZnO)-based materials, indium tin zinc oxide (InSnZnO)-based materials, indium aluminum zinc oxide (InAlZnO)-based materials, tin gallium zinc oxide (SnGaZnO)-based materials, aluminum gallium zinc oxide (AlGaZnO)-based materials, and tin aluminum zinc oxide (SnAlZnO)-based materials which are ternary metal oxides, indium zinc oxide (InZnO)-based materials, tin zinc oxide (SnZnO)-based materials, aluminum zinc oxide (AlZnO)-based materials, zinc magnesium oxide (ZnMgO)-based materials, tin magnesium oxide (SnMgO)-based materials, indium magnesium oxide (InMgO)-based materials, indium gallium oxide (InGaO)-based materials which are binary metal oxides, or indium oxide (InO)-based materials, tin oxide (SnO)-based materials, and zinc oxide (ZnO)-based materials. A composition ratio of respective elements included in the aforementioned respective oxide semiconductor materials is not particularly limited and may be adjusted depending on the characteristic of the TFTs required by the display device.

A gate insulating layer 313 is formed on the active layers 321 and 331. The gate insulating layer 313 insulates the active layers 321 and 331 from the gate electrodes 322 and 332. In some embodiments, the gate insulating layer 313 may be formed of a silicon oxide layer, a silicon nitride layer, or a combination thereof. However, the materials for forming the gate insulating layer 313 are not limited to the aforementioned materials, and the gate insulating layer 313 may include, or be formed of, various other materials.

The gate insulating layer 313 may be formed throughout the substrate 310 over the active layers 321 and 330 on the substrate 310 as depicted in FIG. 3. However, the gate insulating layer 313 only needs to insulate the active layers 321 and 331 from the corresponding gate electrodes 322 and 331. Accordingly, the gate insulating layer 313 can be formed in the area below the gate electrode 322 by using the gate electrode 322 as a mask during a photoresist process. When the gate insulating layer 313 is formed throughout the substrate 310, contact holes may be formed through the gate insulating layer 313 to expose the source area and the drain area of the active layers 321 and 331.

As mentioned above, the gate electrodes 322 and 331 for the first and second thin film transistor 320 and 330 are formed on the gate insulating layer 313. The gate electrodes 322 and 331 for the first and second TFTs 320 and 330 are at least partially overlapped with the active layers 321 and 331 of the first and second thin film transistors 320 and 330. The gate electrodes 322 and 331 may include, but not limited to, molybdenum (Mo), aluminum (Al), chromium (Cr), gold (Au), titanium (Ti), nickel (Ni), neodymium (Nd), and copper (Cu), or an alloy thereof. Further, the gate electrode 322 may be formed as a multi-layered structure, in which each layer is formed of molybdenum (Mo), aluminum (Al), chromium (Cr), gold (Au), titanium (Ti), nickel (Ni), neodymium (Nd), and copper (Cu), or an alloy thereof.

An interlayer insulating layer 312 is formed on the gate electrodes 322 and 331 for the first and second TFTs 320 and 330. The interlayer insulating layer 312 may be formed with the same material as the gate insulating layer 313. For example, the interlayer insulating layer 312 may be formed of a silicon oxide layer, a silicon nitride layer, or a combination thereof. The interlayer insulating layer 312 is formed throughout the substrate 310 and formed to have contact holes opening the source area and the drain area of the active layers 321 and 331. After the interlayer insulating layer 312 is formed, the contact holes of the interlayer insulating layer 312 and the gate insulating layer 313 may be formed at the same time by using a photomask to expose the source area and the drain area of the active layers 321 and 331.

The source electrode 323 and the drain electrode 324 for the first thin film transistor 320 and the source electrode 333 and the drain electrodes 334 for the second thin film transistor 330 are formed on the interlayer insulating layer 312, and are electrically connected to the source areas and the drain areas of the active layers 321, 331 through the contact holes formed in the interlayer insulating layer 312 and/or the gate insulating layer 313. The source electrodes 323, 333 and the drain electrodes 324, 334 of the first and second thin film transistors 320, 330 may be made of one or more of the materials used for forming the gate electrode 322 of the first and second thin film transistors 320, 330.

While each of the sub pixels of the display device are shown as employing two TFTs, it should be appreciated that additional TFTs serving similar and/or extra functionalities can be employed in any one or more of the individual sub pixel areas. Also, while the TFTs depicted in the figures of the present disclosure have a co-planar structure, the type of TFTs is not limited thereto. The organic light emitting display device of the present disclosure can employ TFTs having an inverted-staggered type TFTs.

The capacitor upper electrode 342 and the capacitor lower electrode 341 forms the capacitor 340. A capacitor upper electrode 342 is formed on the interlayer insulating layer 312. The capacitor upper electrode 342 may be formed with the same material as the material forming the source electrodes 323, 333 and the drain electrodes 324, 334. A capacitor lower electrode 341 is formed on the gate insulating layer 313 at the same time while the gate electrode 322 for the first thin film transistor 320 and the gate electrode 332 for the second thin film transistor 330 are formed. The capacitor lower electrode 341 is formed with the same material as the gate electrode 322 for the first thin film transistor 320 and the gate electrode 332 for the second thin film transistor 330. As shown in the FIG. 3, the drain electrode 324 of the first thin film transistor 320 is additionally electrically connected to the capacitor lower electrode 341.

A planarization layer 314 is formed over the first and second TFTs 320 and 330 to create a planar surface on the substrate 310. The planarization layer 314 may be formed of polyacrylates resin, epoxy resin, phenolic resin, poly amides resin, polyimides resin, unsaturated polyesters resin, polyphenylenethers resin, poly-phenylenesulfides resin, benzocyclobutene, and a combination thereof. The material for forming the planarization layer 314 is not limited thereto and may be made of various other materials.

In the first pixel area A, an organic light emitting element, which includes the anode 351, the organic emission layer 352, and the cathode 353, is formed on the planarization layer 314. The organic light emitting element emits light when the holes supplied from the anode 351 and the electrons supplied from the cathode 353 are recombined at the organic emission layer 352. The organic light emitting element in each of the sub pixel is driven individually by the TFTs described above, and the light generated from the multiple organic light emitting elements collectively forms a display image.

The anode 351 is disposed on the planarization layer 314 of each of the first sub pixel area A. The anode 351 is made of a conductive material having a high work function because the hole needs to be supplied. In some embodiments, the anode 351 includes a transparent conductive layer 354 having a high work function such as transparent conductive oxide (TCO). The TCO forming the transparent conductive layer 354 of the anode 351 may include, but are not limited to, indium tin oxide (ITO), indium zinc oxide (IZO), indium tin zinc oxide (ITZO), zinc oxide, tin oxide, and a combination thereof.

The anode 351 is connected with the source electrode 333 of the second thin film transistor 330 through the contact hole formed in the planarization layer 314. Assuming the thin film transistor is an N-type thin film transistor, the anode 351 is connected with the source electrode 333 of the second thin film transistor 330. In case where the thin film transistor is a P-type thin film transistor, however, the anode 351 is be connected to the drain electrode 334 of the second thin film transistor 330. The anode 351 may be configured to directly contact the organic emission layer 352 or via a conductive material disposed therebetween.

In case of the top emission type organic light emitting display device, the light emitted from the organic emission layer 352 needs to exit towards the upper side (i.e., through the cathode) of the organic light emitting display device 300. However, the light emitted from the organic emission layer 352 would exit through the anode 351 if the anode 351 is formed only with the transparent conductive layer, and results in reduced light efficiency of the organic light emitting display device 300. Accordingly, the anode 351 may include a low resistance reflective layer 355 to maximize the amount of light exiting towards the upper side of the organic light emitting display device 300. The reflective layer 355 is formed by a conductive layer having excellent reflectance, and for example, may be formed by silver (Ag), nickel (Ni), gold (Au), platinum (Pt), aluminum (Al), copper (Cu), and molybdenum/aluminum neodymium (Mo/AlNd).

In the present disclosure, the anode 351 is described as being formed by a stack of first and second conductive layers 354 and 355. However, it should be appreciated that the anode 351 can be formed of a single layer. For instance, in some embodiments, the anode 351 can be formed as a single conductive layer, which meets the high work function property as well as the light reflection property necessary for the top emission type OLED element.

In the exemplary embodiment depicted in FIG. 3, the reflective layer 355 and the transparent conductive layer 354 of the anode 351 are electrically connected to the drain electrode of the driving transistor. In FIG. 3, the reflective layer 355 is illustrated as being in contact with the drain electrode 333, but in some embodiments, the transparent conductive layer 354 may be configured to contact the drain electrode 334 via a contact hole formed through the planarization layer 314.

As briefly mentioned above, each of the sub pixels of the display device includes a separate anode 351. For example, the anodes 351 are formed in the emissive area EA of the first sub pixel area A and the second sub pixel are a B, and each of the anodes 351 in the respective sub pixel is driven independently from the other anode. The transparent conductive layer 354 may not affect much to the light transmittance rate of the transmissive area even if it is extended further into the part of the transmissive area TA. In contrast, considerable amount of the light transmittance rate at the transmissive area TA will be lost if the reflective layer 355 extends further into the part of the transmissive area TA.

The auxiliary electrode 360 is formed in the intermediate area C on the substrate 310. The auxiliary electrode 360 is disposed between the first sub-pixel area A and the second sub-pixel area B such that the auxiliary electrode 360 is closer to the emissive area EA of the first sub-pixel A and the emissive area EA of the second sub-pixel area B than the transmissive area TA of the first sub-pixel area A and the transmissive area TA of the second sub-pixel B. As described above, since the buffer layer 311, the gate insulating layer 313, the interlayer insulating layer 312, and the planarization layer 314 are sequentially formed on the entire substrate 310, the auxiliary electrode 360 is formed on the planarization layer 314 corresponding to the intermediate area C. It is preferred that the auxiliary electrode 360 is formed of a low resistance conductive material in order to counteract the voltage drop caused by the relatively high resistance of the cathode 353.

To simplify the process and reduce the manufacturing time of the display device, the anodes 351 in the first and second sub pixel areas A and B as well as the auxiliary electrode 360 may be formed at the same time during the manufacturing of the display device. Accordingly, the auxiliary electrode 360 and the anode 351 may be made formed in the similar layer structure, thickness and/or formed of the same material. For instance, both the auxiliary electrode 360 and the anode 351 may be formed in a stack of the transparent conductive layer 361 (i.e., the first conductive layer) and the reflective layer 362 (i.e., the sec and conductive layer). Also, the transparent conductive layer 361 and the reflective layer 362 of the auxiliary electrode 360 can be formed of the same material as the transparent conductive layer 354 and the reflective layer 355 of the anode 351.

Various factors need to be considered to determine the dimension (e.g., length, width and thickness) and the layout of the auxiliary electrode 360 within the display device. In particular, the surface resistance value of the cathode is an important factor for determining the dimension and the layout of the auxiliary electrode 360. The surface resistance value of the cathode can be calculated from the electrical property of the material forming the cathode and the size of the cathode employed in the display device. Based on the surface resistance of the cathode, the dimension of the auxiliary electrode 360 and the disposition interval of the auxiliary electrode 360, which are sufficient for reducing the voltage drop, can be determined.

As mentioned above, the auxiliary electrode 360 is disposed in the intermediate area C between the first sub pixel area A and the second sub pixel area B which are symmetrically disposed with respect to each other. That is, configuration of the emissive area EA and the transmissive area TA of the first and second sub pixels mirrors each other. Although not depicted in FIG. 3, the auxiliary electrode 360 disposed between the two sub pixels A and B is extended out, and is electrically connected with a pad portion formed in a non-pixel area to receive a predetermined voltage (e.g., a ground GND or negative voltage) from the outside.

In the exemplary embodiment of the display device shown in FIG. 3, the banks 315 are formed on both sides of the auxiliary electrode 360. The banks 315 separate two adjacent sub pixels. More specifically, the banks 315 include a first bank 316 covering one side portion of the auxiliary electrode 360 and one side portion of the anode 351 of the first sub pixel area A, and a second bank 317 covering the other side portion of the auxiliary electrode 360 and one side of the anode 351 of the second sub pixel area B. The banks 315 may be made of an organic insulating material, for example, any one of polyimide, photo acryl, and benzocyclobutene (BCB). The banks 315 may have a tapered shape. When the banks 315 have the tapered shape, the banks 315 may be formed by using a positive type photoresist. The banks 315 are formed to have a thick ness sufficient for separating the adjacent sub pixels, for example, a thickness of about 1 μm. As shown in FIG. 3, additional bank may be formed between the emissive area EA and the transmissive area TA in the first and second sub pixels if a separation of the EA and the TA is desired within a sub pixel.

In FIG. 3, the organic emission layer 352 formed in the first sub pixel area A and the second sub pixel area B is isolated from each other. Also, the organic emission layer 352 is not disposed in the intermediate area C. That is, the organic emission layer 352 is not disposed on the auxiliary electrode 360.

In order to form the organic emission layer 352 discretely in the first sub pixel area A and the second sub pixel area B, a shadow mask including a fine metal mask (FMM) may be used. More specifically, the organic emission layer 352 may be formed by using a shadow mask including a fine metal mask (FMM) having openings that corresponds to the emissive area EA and the transmissive area TA of the first sub pixel area A and the emissive area EA and the transmissive area TA of the second sub pixel area B. Further, in order to form the organic emission layer 352, a mask-free technique such as laser induced thermal imaging (LITI), laser induced patternwise sublimation (LIPS), and soluble printing may also be used.

Since each sub pixel in the RGB OLED type display device needs to have an organic emission layer for emitting different colored light, the organic emission layer in each of the sub pixels is deposited separately from the organic emission layer in other sub pixels. Accordingly, the organic emission layer will not be deposited over the auxiliary electrode, and this makes it easier for the cathode 353 to contact with the auxiliary electrode in comparison to the white OLED type display device, which will be described below in reference to FIG. 4. Accordingly, the organic emission layer configuration depicted in FIG. 3 is particularly useful for the RGB OLED type display device. However, it should be appreciated that the organic emission layer for the white OLED type display device can also be patterned and formed separately in the first and second sub pixel areas A and B by using any of the methods described above. In such cases, the white OLED type display device may be configured as shown in FIG. 3.

In each sub pixel, the organic emission layer 352 is formed in both the emissive area EA and the transmissive area TA. However, the organic emission layer 352 of the first and second sub pixels are not formed on the intermediate area C. Since the organic emission layer 352 is substantially transparent in a non-emission state, the organic emission layer 352 may be formed in the transmissive area TA.

The cathode 353 is formed on the organic emission layer 352 of each of the first sub pixel area A and the second sub pixel area B and the auxiliary electrode 360. Since the cathode 353 needs to supply electrons, the cathode 353 is made of a material having high electric conductivity and a low work function, that is, a cathode material. The detailed material configuring the cathode 353 varies according to an emission type of the organic light emitting display device 300. As illustrated in FIG. 3, in case where the organic light emitting display device 300 employs top emission type organic light emitting elements, the cathode 353 is formed of a metallic material having a very thin thickness and a low work function. The material for forming the cathode 353 may include, but not limited to, silver (Ag), titanium (Ti), aluminum (Al), molybdenum (Mo), or an alloy of silver (Ag) and magnesium (Mg). Even though the material forming the cathode 353 is metal which is opaque and has high reflectance, when the cathode 353 becomes thin at a predetermined thickness (for example, 200 Å) or less, transmittance is gradually increased. As such, the cathode 353 can be formed to have a thickness of hundreds Å or less, for example, 200 Å or less. In this setting, the cathode 353 is substantially transparent or semi-transparent. In some embodiments, the cathode 353 can be formed of carbon nano tube (CNT) and/or graphene based composite materials, which can provide excellent electrical conductivity and transparency. Such carbon based composite materials may include metallic material to provide the low work function characteristic to the cathode 353.

The cathode 353 is formed over the first sub pixel area A, the second sub pixel area B and the intermediate area C. More specifically, the cathode 353 is deposited on the emissive area EA and the transmissive area TA of the first sub pixel area A, the emissive area EA and the transmissive area TA of the second sub pixel area B, and the intermediate area C, so that the parts of the cathode 353 in the first and second sub pixel areas A and B are electrically connected to the auxiliary electrode formed in the intermediate area C.

Although not shown in FIG. 3, an encapsulation part, which is a sealing member, may be disposed over the organic light emitting element(s) to provide protection for the organic light emitting element and/or the thin film transistor(s) from moisture, air, impact, and the like from the external environment. The encapsulation part may also serve as a support and/or protective member positioned above the organic light emitting display device 300. In case where the display device 300 is the white OLED type display device, color filter(s) (not shown) may be formed in/or the encapsulation part.

In a large-sized organic light emitting display device is manufactured, the resistance of the cathode 353 has a large effect on uniformity of luminance of the entire display. Increasing the thickness of the cathode 353 can reduce the resistance of the cathode 353. However, there is a limit as to the thickness of the cathode 353 in a display device. For example, the increase in the thickness of the cathode 353 decreases the transparency of the emissive area EA and the transmissive area TA, thereby negatively affecting luminance at the emissive area EA and the light transmittance rate at the transmissive area TA. At least in theory, the voltage drop caused by the cathode 353 can be countered and obtain uniform luminance throughout the display without increasing the thickness of the cathode 353 by employing the auxiliary electrode 360 electrically connected to the cathode 353.

However, the auxiliary electrode 360 itself requires to have sufficient size, to have sufficient electrical conductivity (low resistance), and needs to be arranged sufficiently close to the sub pixels. As briefly described above, the auxiliary electrode may be made of metallic material, which may have detrimental effect on light transmittance rate of the display device. Accordingly, the physical size and the layout of the auxiliary electrode on one hand and the size and layout of the emissive area EA or the transmissive area TA on the other hand are in a trade-off relationship. That is, the more the area taken up by the auxiliary electrode within the display device, the lesser the area of the emissive area EA or the area of the transmissive area TA of a sub pixel in the display device. With smaller emissive area EA, the luminance of the organic light emitting display device 300 may be reduced or may require additional power to maintain the similar luminance. With smaller transmissive area TA, the light transmittance rate through the organic light emitting display device 300 is reduced, thereby losing its merits as the transparent display device.

For the reasons stated above, the organic light emitting display device of the present disclosure is designed such that at least two adjacent sub pixels to share the auxiliary electrode and to have pixel layout for greater overall light transmittance rate. Accordingly, non-uniformity of luminance caused by the voltage drop can be reduced without negatively affecting the aperture ratio of the sub pixels, resulting in a transparent display device with uniform luminance and excellent light transmittance rate.

As shown in FIG. 3, the first sub pixel area A and the second sub pixel area B mirror each other in reference to the auxiliary electrode 360 formed in the intermediate area C. That is, the auxiliary electrode 60 is disposed between the emissive area EA of the first sub pixel area A and the emissive area EA of the second sub pixel area B. In the present disclosure, "symmetric" or "substantially symmetric" may include a perfect symmetric structure and further, a generally symmetric structure although sizes, thicknesses, heights, shapes, and the like of corresponding elements are not perfectly symmetric each other. For example, the first sub pixel area A and the second sub pixel area B are arranged symmetric to each other in reference to the auxiliary electrode 360, since the emissive area EA and the transmissive area TA of the first sub pixel area A and the second sub pixel area B laid out in the same order from the auxiliary electrode 360.

Figure 4:
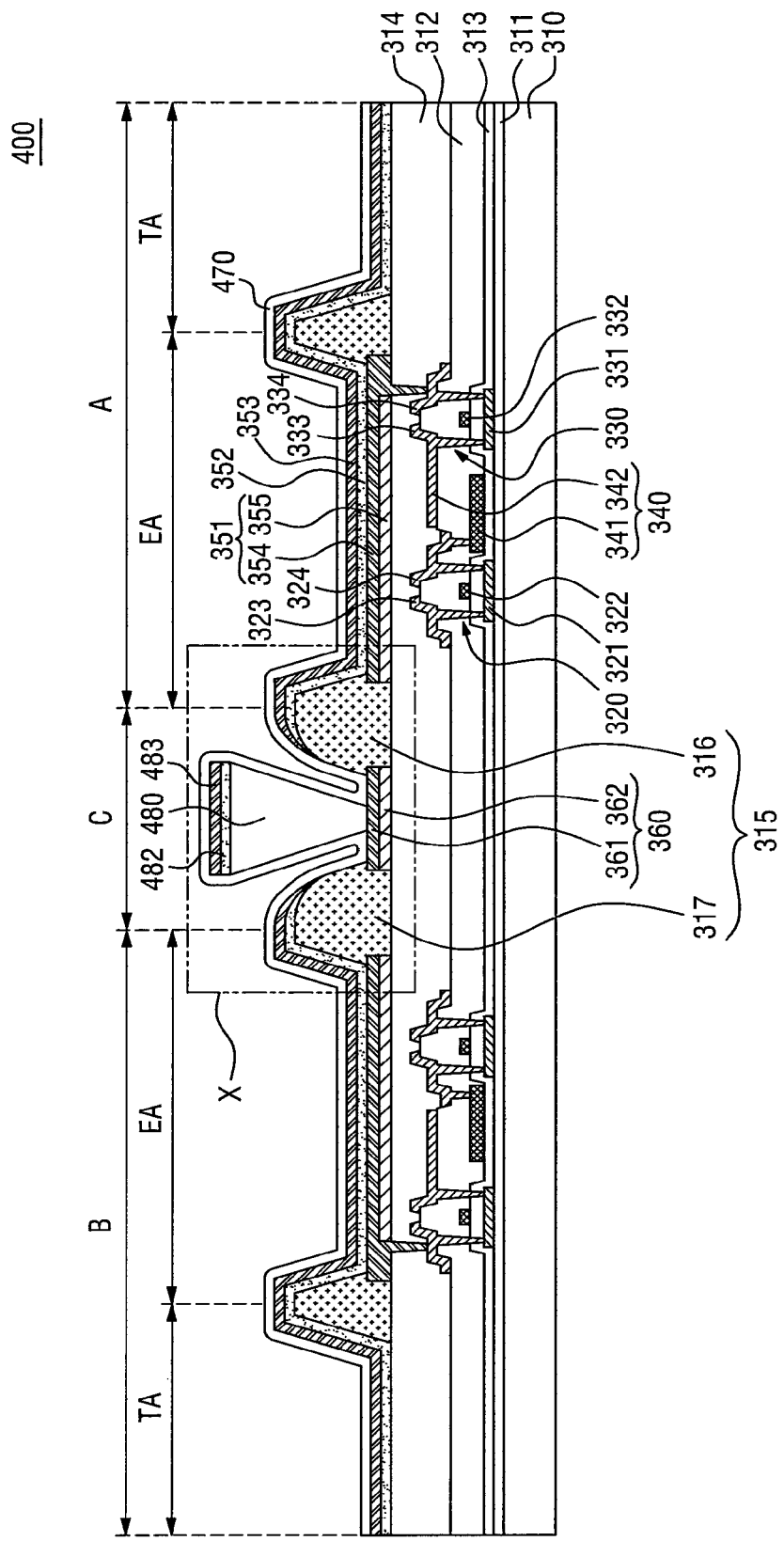

FIG. 4 illustrates an exemplary embodiment of the organic light emitting display device 400. The organic light emitting display device 400 includes a substrate 310, thin film transistors 320 and 330, an anode 351, an organic emission layer 352, a cathode 353, and an auxiliary electrode 360, which are substantially the same as those depicted in FIG. 3. The organic light emitting display device 400 further comprises a partition 480, a transparent conductive layer 470, an organic layer 482, and a metal layer 483 as will be further described below.

In one embodiment, a conductive element includes the cathode 453 of the sub-pixel area A, the cathode of the sub-pixel area B, and the transparent conductive layer 470. Alternatively, the conductive element includes only the transparent conductive layer 470.

In the exemplary embodiment of the organic light emitting display device 400, the partition 480 is formed on the auxiliary electrode 360. The partition 480 is particularly useful for the white OLED type display device. Unlike the RGB OLED type display device requiring a fine metal mask (FMM) to pattern the organic emission layer 352 in each sub pixel area, the organic emission lay er for the white OLED type display device can be deposited over the large area of the display device without using the FMM. However, when the organic emission layer for the white OLED type display device is deposited over the auxiliary electrode, the cathode may not contact the auxiliary electrode due to the organic emission layer interposed between the cathode and the auxiliary electrode. For this reason, the partition 480 has a shape capable to isolate the organic emission layers 352 of the first and second sub pixel areas A and B and to expose at least some portion of the auxiliary electrode 360. The exposed part of the auxiliary electrode 360 allows for the electrical connection between the cathode 353 and the auxiliary electrode 360.

Figure 5:
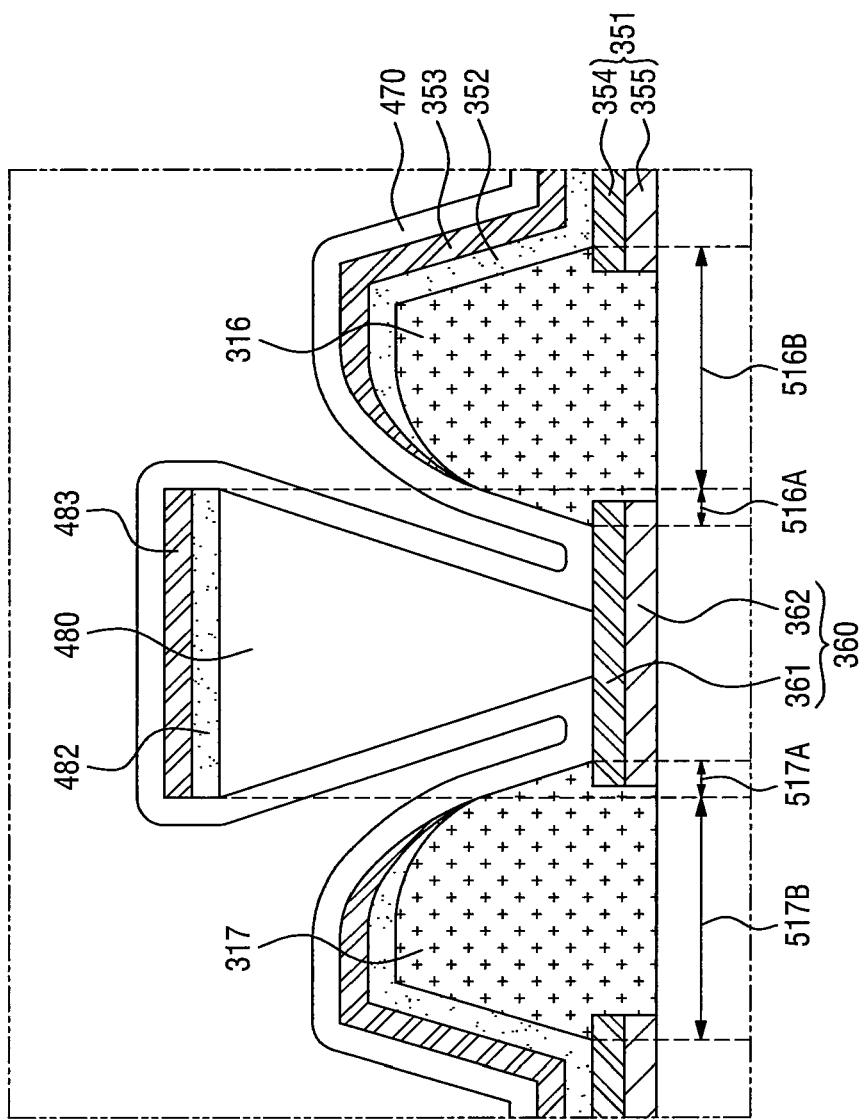
FIG. 5 is an enlarged diagram for an area X of FIG. 4 according to the exemplary embodiment.

Referring now to FIG. 5 showing the enlarged view of the area "X" of the FIG. 4, the partition 480 has a reverse-tapered shape. That is, the lower surface of the partition 480 contacts the upper surface of the auxiliary electrode 360, and the upper portion of the partition 480 is wider than the lower portion of the partition 580. A negative type photoresist may be used in order to form the partition 480 in the reverse-tapered or the reversely mesa shape. For example, the negative type photoresist coated over the auxiliary electrode 360 can be partially exposed and developed to form the partition 480 to have the reversely tapered shape. The partition 480 may be formed thicker than the bank 315, for example from about 1 μm to 2.5 μm, to isolate the organic emission layer 352. As shown in FIG. 5, the organic layer 482 is formed on the wider portion of the partition 480 and the metal layer 483 is formed on the organic layer 482. In one embodiment, the organic layer 482 and the metal layer 483 do not perform any function and are formed as a result of forming the organic emission layer 352 and the cathode 353.

The partition 480 may be arranged to partially overlap with the first bank 316 and the second bank 317. Accordingly, the first bank 316 and the second bank 317 may divided into a first area (516A, 517A) and a second area (516B, 517B). The first area (516A, 517A) of the banks 315 refers to the part of the respective bank (e.g., the first bank 316 or the second bank 317) overlapping with the upper portion of the partition 480, and the second area (516B, 517B) of the bank 315 refers to the part of the respective bank that does not overlap with the upper side of the partition 480.

As described above, it is important to expose at least some physical space of the auxiliary electrode to obtain the benefit. Generally, the material for forming the organic emission layer has low step coverage, and thus the organic emission layer 352 is not deposited in the first area of the first bank layer 316 and the first area of the second bank layer 317. In short, the partition 480 allows at least some portion of the auxiliary electrode 360 to be exposed without the organic emission layer deposited thereon, thereby ensuring the cathode 353 to contact the auxiliary electrode 360.

The cathode 353 may be formed by a similar deposition method as the deposition method for the organic emission layer 352, and the metallic material for forming the cathode 353 may also have low step coverage. Depending on the size of the exposed part of the auxiliary electrode 360, it may be difficult for the cathode 353 to be contact the auxiliary electrode 360. Accordingly, a transparent conductive layer 470, which has higher step coverage than the cathode 553, may be formed over the first and second sub pixel areas A and B and the intermediate area C.

With higher step coverage, the transparent conductive layer 470 may cover the sides and the upper surfaces of the partition 480. Accordingly, the transparent conductive layer 470 is formed over the cathode 353 in both the first and second sub pixel areas A and B, the exposed parts of the auxiliary electrode 360, and the sides and upper surfaces of the partition 480. As such, the trans parent conductive layer 470 ensures the electrical connection between the cathode 353 and the auxiliary electrode 360. The transparent conductive layer 470 may be formed of oxide metal material including, but not limited to, indium tin oxide (ITO), indium zinc oxide (IZO), indium tin zinc oxide (ITZO), zinc oxide, tin oxide, and a combination thereof. To have sufficient electrical conductivity, the transparent conductive layer 470 may be formed with a thickness of about 100 Å or more. The transparent conductive layer 470 functions as a conductive connection layer by connecting the cathode 353 of the first sub pixel area A, the auxiliary electrode 360, and the cathode 353 of the second sub pixel area B.

In order to increase the exposed part of the auxiliary electrode 360, the partition 480 may be formed such that its upper surface has greater lateral length than that of the auxiliary electrode 360. However, the lateral of the partition 380 at its upper surface may be equal to or shorter than the lateral length of the auxiliary electrode 360 so long as the amount of overlap between the bank 315 and the partition 480 is sufficient to expose at least some part of the auxiliary electrode 360.

Although the partition 480 is illustrated as being formed in the center of the auxiliary electrode 360, the location of the partition 480 on the auxiliary electrode 360 is not limited as such. The position of the partition 480 on the auxiliary electrode can be changed within a range in which an overcurrent does not flow in the transparent conductive layer 470. That is, the partition 480 may be formed to be closer to any one of the first bank 316 and the second bank 317, and may even be formed to contact any one of the first bank 316 and the second bank 317.

Figure 6:
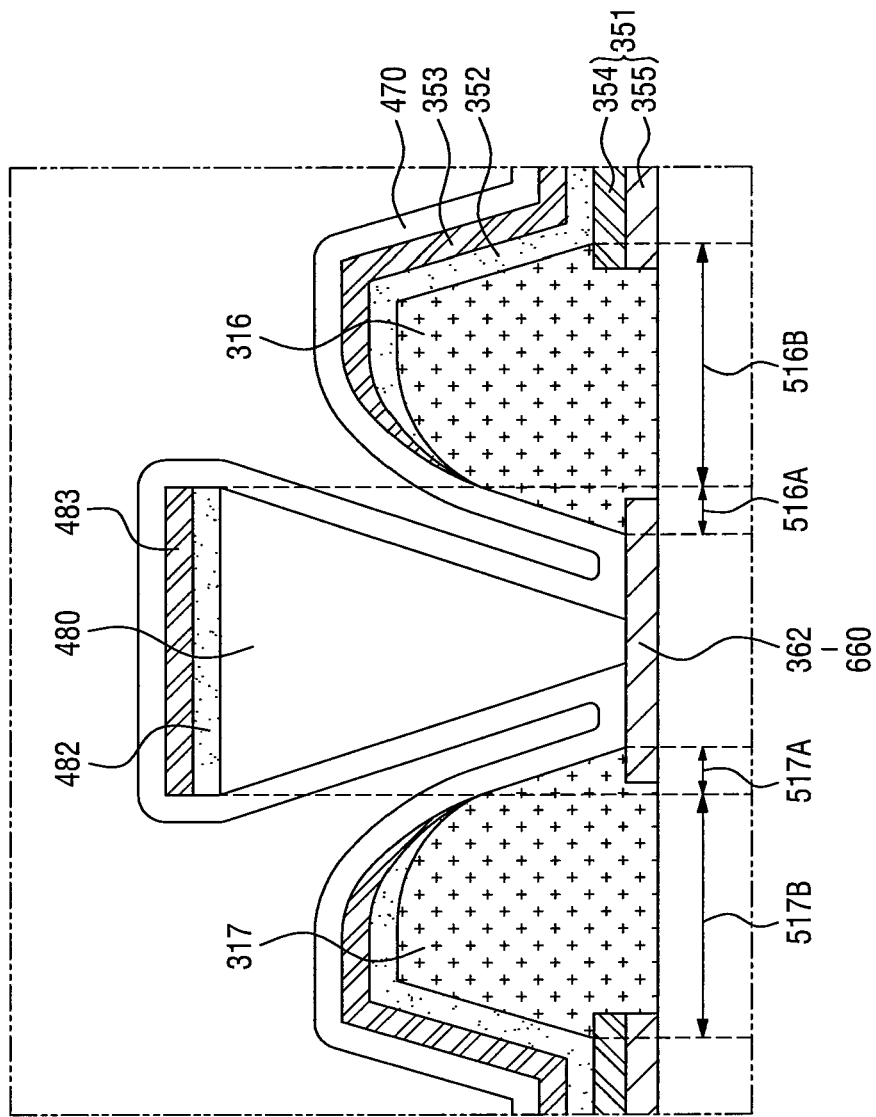
FIG. 6 is an enlarged diagram for an area X of FIG. 4 according to the exemplary embodiment.

FIG. 6 illustrates yet another exemplary configuration of the partition and the auxiliary electrode. In the embodiment of FIG. 6, the auxiliary electrode 660 may be formed with the same material as the anode 351 to simplify the manufacturing process. As such, the auxiliary electrode 660 can have the same layering structure as the anode 351. However, it should be noted that the primary reason for using the auxiliary electrode 660 is to reduce voltage drop caused by the relatively high electrical resistance of the cathode 353. In other words, lowering the electrical resistance characteristic of the cathode 353 is the priority to the auxiliary electrode 660. Accordingly, the auxiliary electrode 660 can be formed with the reflective layer 362, which has lower electrical resistance than the transparent conducive material for forming the upper layer 354 of the anode 351. In this exemplary configuration, the lateral length of the auxiliary electrode 660 may be about 5 μnm, and the thickness of the auxiliary electrode 660 may be about 1,000 Å or more.

Figure 7:
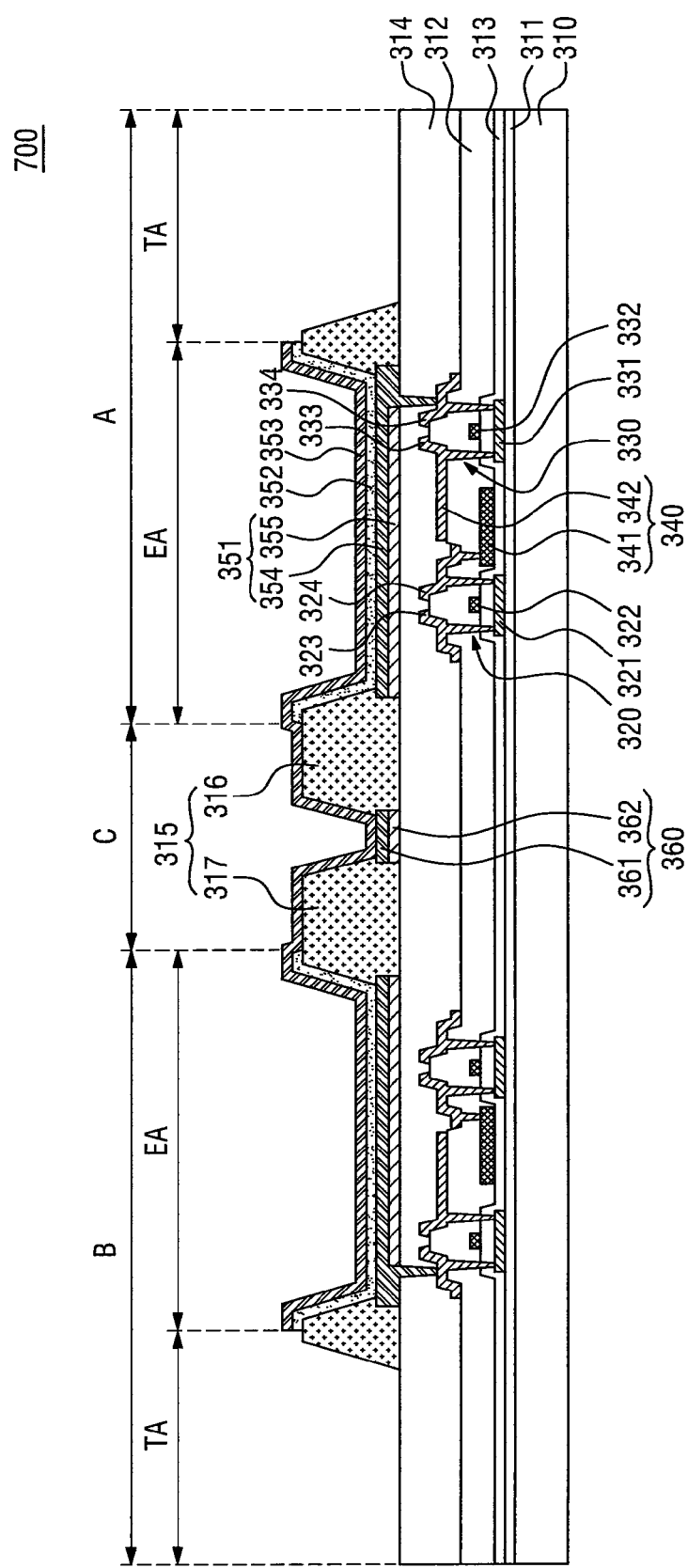
FIGS. 7 to 8 are cross-sectional views of organic light emitting display devices according to various exemplary embodiments of the present disclosure.
Figure 8:
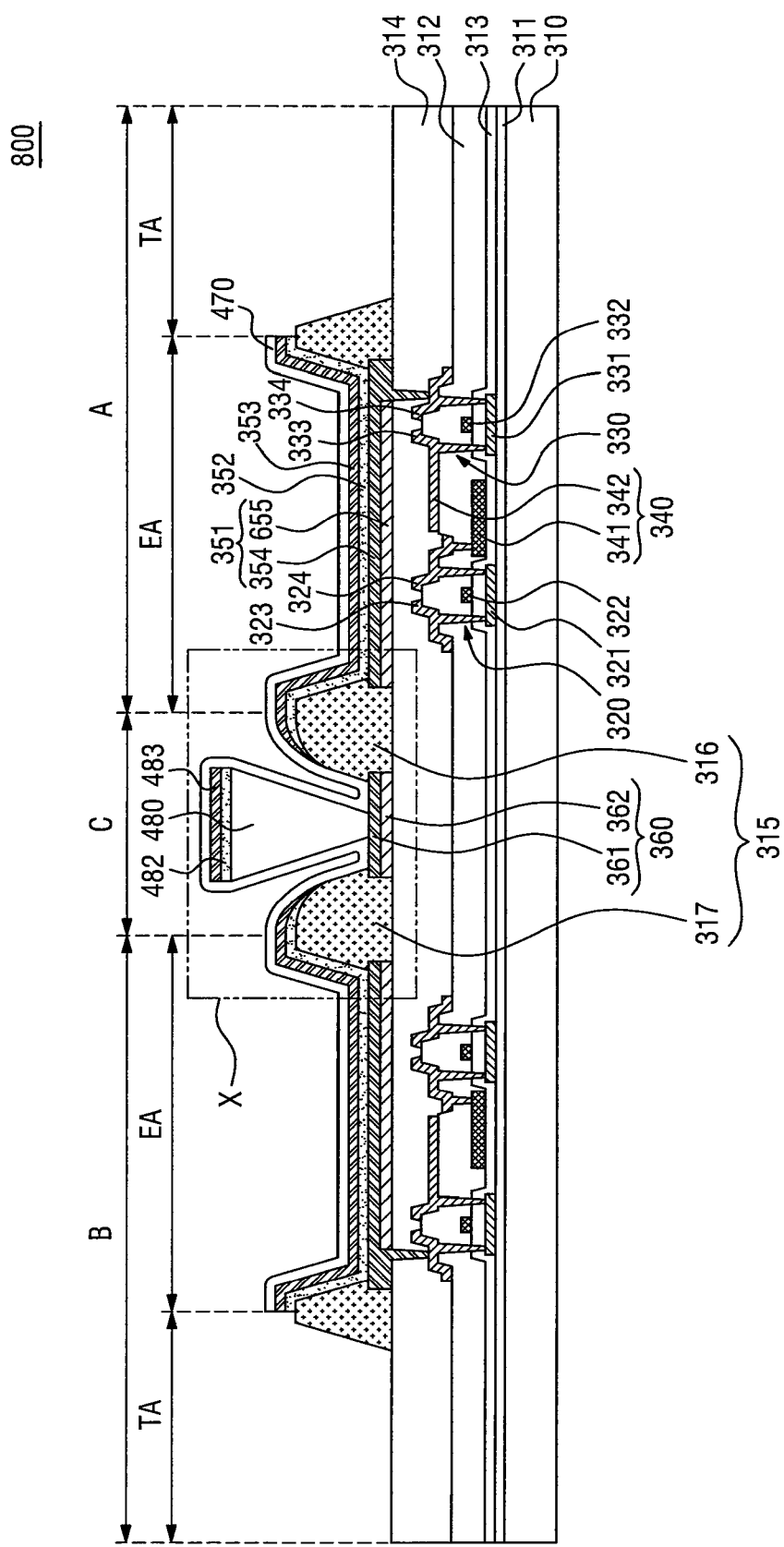

FIG. 7 and FIG. 8, each illustrates an exemplary embodiment of the organic light emitting display devices 700 and 800. The organic light emitting display devices 700 includes a substrate 310, thin film transistors 320 and 330, an anode 351, an organic emission layer 352, a cathode 353, an auxiliary electrode 360, which are substantially the same as those depicted in FIG. 3. The organic light emitting display devices 800 includes a substrate 310, thin film transistors 320 and 330, an anode 351, an organic emission layer 352, a cathode 353, an auxiliary electrode 360, a partition 480, and a transparent conductive layer 470, which are substantially the same as those depicted in FIG. 4. Repeated description of those elements will be omitted from the present disclosure.

Increased light transmittance rate may be obtained by eliminating the organic emission layer 352 and the cathode 353 from the transmissive area TA. Accordingly, in the organic light emitting display devices 700 and 800, the organic emission layer 352 formed in each of the first sub pixel area A and the second sub pixel area B is formed only in the emissive area EA. That is, the organic emission layer 352 and the cathode 353 are not formed in the transmissive area TA of each of the first sub pixel area A and the second sub pixel area B. In the organic light emitting display device 800, the transparent conductive layer 470 is not formed in the transmissive area TA of the sub pixel areas A and B.

It should be noted that other elements that may negatively affect the light transmittance rate at the transmissive area TA can be removed from the transmissive area TA. For instance, the planarization layer, the interlayer insulating layer, the gate insulation layer and the likes, may not be disposed in the transmissive layer TA for increased light transmittance rate. Elimination of such elements may also provide greater mechanical flexibility to the organic light emitting display device.

Figure 9:
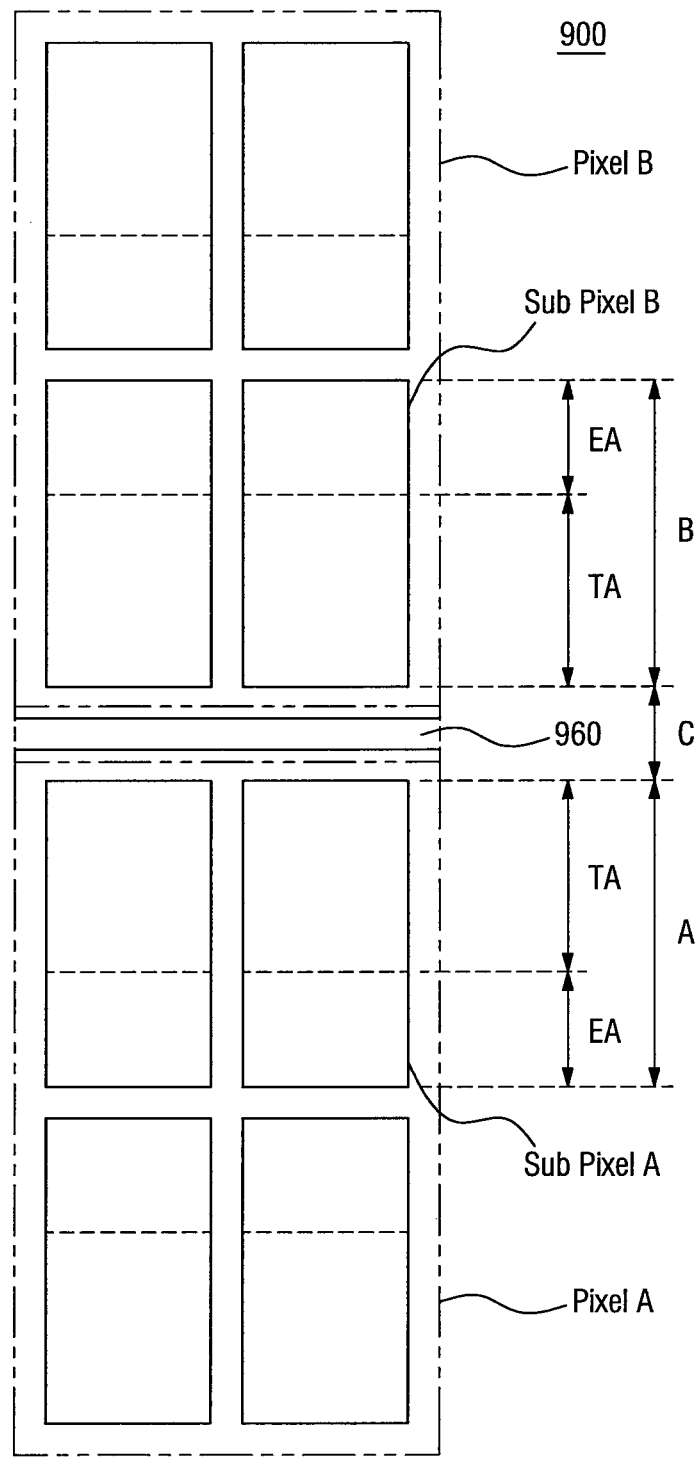
FIG. 9 is a plan conceptual view of an organic light emitting display device according to an embodiment.

FIG. 9 is a plan view showing an exemplary pixel arrangement in an organic light emitting display device according to an embodiment of the present disclosure. In FIG. 9, the organic light emitting display device 900 includes a first sub pixel area A and a second sub pixel area B. An intermediate area C is disposed between the first sub pixel area A and the second sub pixel area B. In detail, the intermediate area C is disposed between a transmissive area TA of the first sub pixel area A and a transmissive area TA of the second sub pixel area B. The first sub pixel area A and the second sub pixel area B symmetrically disposed to mirrors each other relative to the intermediate area C. Accordingly, an emissive area EA of the first sub pixel area A, the transmissive area TA of the first sub pixel area A, the auxiliary electrode 960, the transmissive area TA of the second sub pixel area B, and an emissive area EA of the second sub pixel area B are sequentially disposed in the stated order. In particular, the auxiliary electrode 960 is disposed between the first sub-pixel A and the second su b-pixel B such that the auxiliary electrode 960 is closer to the transmissive area TA of the first sub-pixel A and a transmissive area TA of the second sub-pixel B than an emissive area EA of the first sub-pixel A and an emissive area of the second sub-pixel B.

Unlike the pixel arrangement described along with FIG. 2, the transmissive area TA of the first and second sub pixels are disposed adjacent to the auxiliary electrode 960 in FIG. 9. All of the sub pixels in the pixels A are configured so that their emissive areas EA are arranged to be next to each other. Likewise, the emissive areas EA of the sub pixels in the pixel B are arranged to be next to each other.

Figure 10:
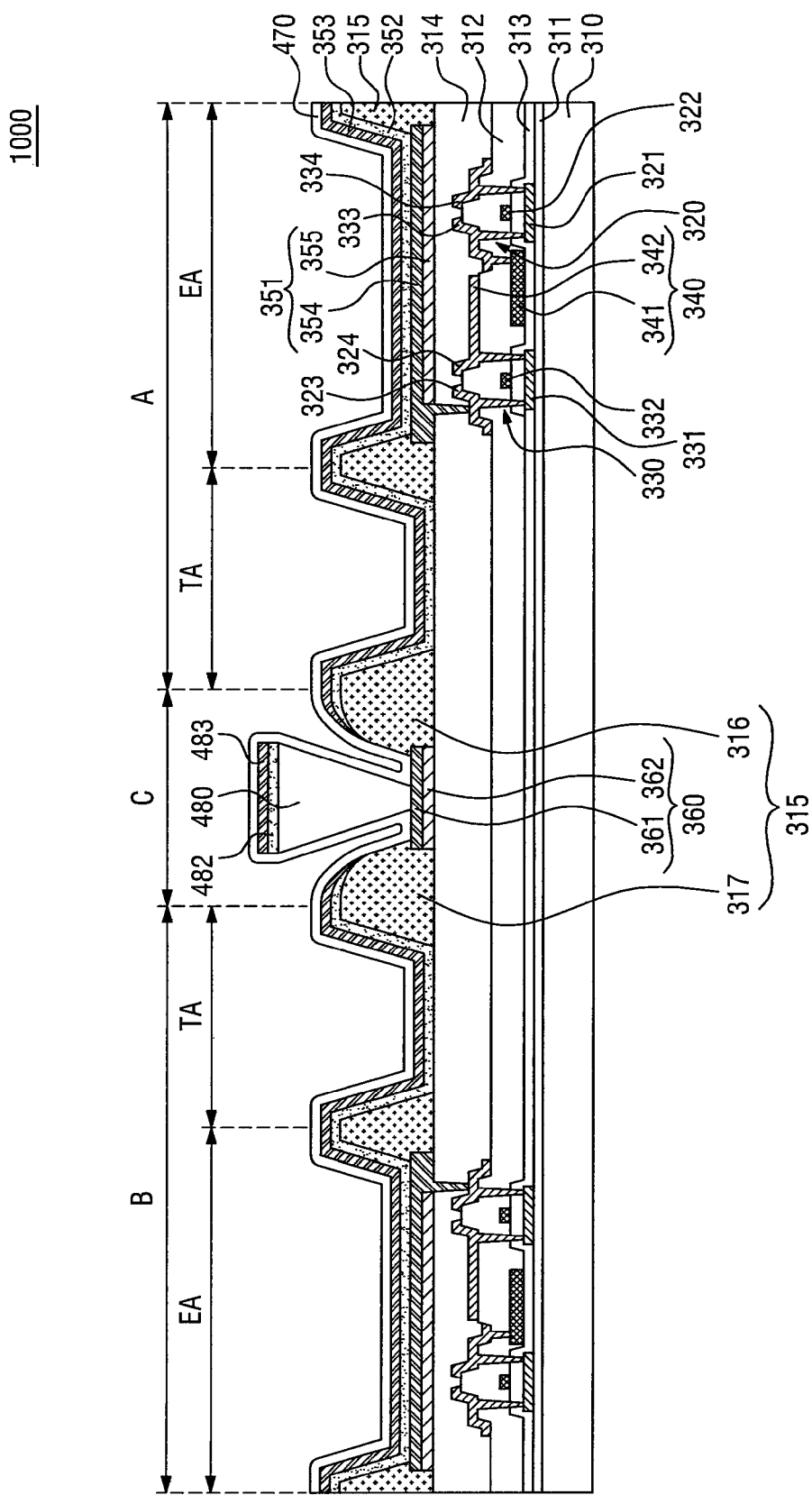
FIGS. 10 and 11 are cross-sectional views of organic light emitting display devices according to various exemplary embodiments.
Figure 11:
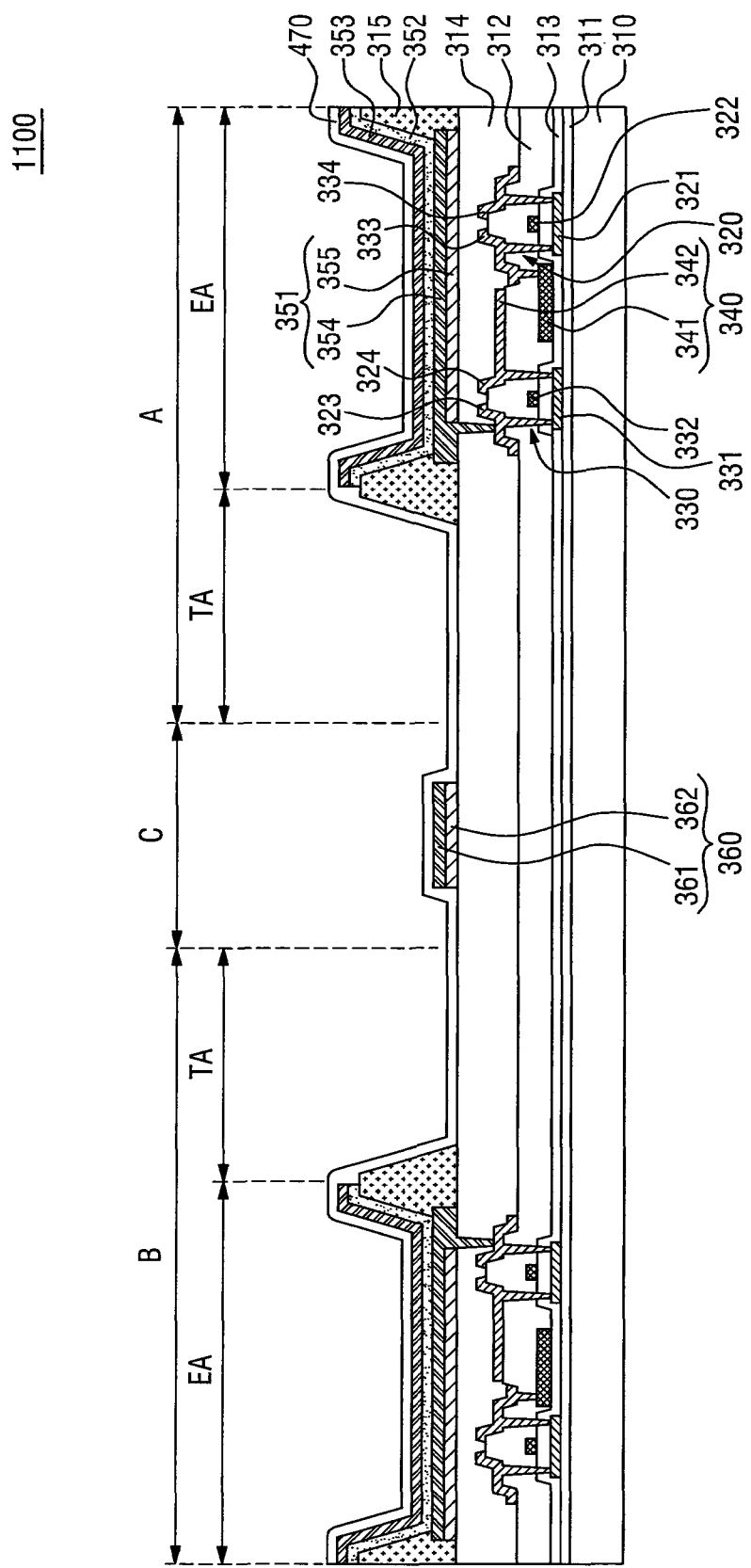

FIGS. 10 and 11 illustrates a cross-sectional view of an organic light emitting display device with the transmissive area TA of the first and second sub pixels being disposed adjacent to the auxiliary electrode.

First, referring to FIG. 10, the organic light emitting display device 1000 includes a substrate 310, thin film transistors 320 and 330, an anode 351, an organic emission layer 352, a cathode 353, an auxiliary electrode 360, a partition 480, and a transparent conductive layer 470 as previously described with respect to FIGS. 3 and 4. Since the organic light emitting display device 1000 includes elements that are similar to those described with respect to FIGS. 3 and 4, the description of those elements will not be provided.

The first sub pixel area A and the second sub pixel area B symmetric ally disposed relative to the auxiliary electrode 360 therebetween. That is, the auxiliary electrode 360 is disposed between the first sub pixel area A and the second sub pixel area B. In this exemplary embodiment, however, the transmissive area TA of the first sub pixel area A and the transmissive area TA of the second sub pixel area B are adjacent to the auxiliary electrode 360. The emissive area EA of the first sub pixel area A and the emissive area EA of the second sub pixel area B are disposed away from the auxiliary electrode 360.

The organic emission layer 352 disposed in the first pixel area A to the second sub pixel area B. In each of the sub pixel areas A and B, the organic emission layer 352 in the emissive area EA is extended over into the transmissive area TA. Accordingly, the partition 480 disposed on the auxiliary electrode 360 isolates the organic emission layer 352 in the first sub pixel area A and the second sub pixel area B. As discussed above, the partition 480 has a shape that can expose at least some portion of the auxiliary electrode 360 so that the auxiliary electrode 360 and the cathode 353 are electrically connected to each other. In the example depicted in FIG. 10, the banks 315 are formed next to the partition 480. However, it should be noted that the banks 315 need not be formed next to the partition 480 so long as the partition 480 can expose the auxiliary electrode 360.

Next, referring to FIG. 11, the organic light emitting display device 1100 includes a substrate 310, thin film transistors 320 and 330, an anode 351, an organic emission layer 352, a cathode 353, an auxiliary electrode 360, and a transparent conductive layer 470. Since the organic light emitting display device 1100 includes elements that are similar to those described with respect to FIGS. 3 and 4, the duplicated description will not be provided.

In the exemplary organic light emitting display device 1100, the organic emission layer 352 is formed only in the emissive area EA of each of the sub pixel areas A and B. That is, the organic emission layer 352 is not formed in a transmissive area TA of each of the first sub pixel area A and the second sub pixel area B and the intermediate area C. Because the organic emission layer 352 is not extended into the transmissive area TA and the intermediate area C, the banks 315 and the partition 480 shown in FIG. 10 are not needed to expose the auxiliary electrode 1060.

The organic light emitting element in the present example is the top emission type, and thus the cathode 353 is made of a thin metal layer to be transparent. While the light transmittance rate of the cathode 353 may be sufficient for the light emitted from the organic emission layer 352 to pass through, the light transmittance rate of the cathode 353 may still negatively affect the light transmittance rate at the transmissive area TA. While the transparent conductive layer 1170 may have higher electrical resistance than the cathode 353, it may offer better light transmittance rate than the cathode 353. As such, in the example shown in FIG. 11, the cathode 353 is formed only in the emissive area EA of the first and second sub pixel areas A and B. The electrical connection between the cathode 353 and the auxiliary electrode 360 is achieved via the transparent conductive layer 470 formed throughout the first sub pixel area A, the second sub pixel area B, and the intermediate area C.

The electrical resistance and the light transmittance rate of the cathode 353 and the transparent conductive layer 470 can vary depending on the materials for forming the cathode 353 and the transparent conductive layer 470. Accordingly, in some other embodiments, the cathode 353 may be disposed in the transmissive area TA of the first and second sub pixel areas A and B, so that the cathode 353 contacts directly to the auxiliary electrode 360 without using the transparent conductive layer 470.

Figure 12:
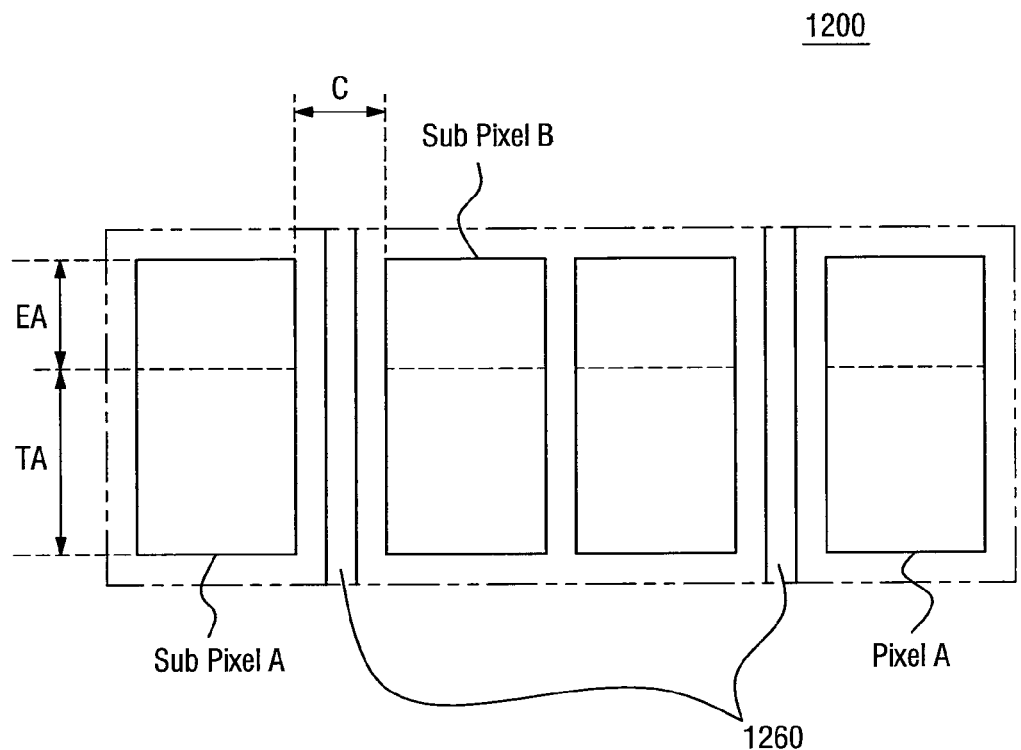
FIG. 12 is a plan conceptual view of an organic light emitting display device according to an embodiment.

It should be noted that arrangement of the transmissive area TA and the emissive area EA for the sub pixels adjacent to the auxiliary electrode 360 is not limited as the above described embodiments. Accordingly, in some embodiments, the emissive area EA and the transmissive area TA of within a sub pixel are arranged in the same direction as the direction of the auxiliary electrode within the organic light emitting display device. That is, the direction of arrangement of the emissive area EA and the transmissive area TA in a sub pixel is parallel to the direction of the auxiliary electrode extending in the display device. For example, both the emissive area EA and the transmissive area TA of the first sub pixel area A as well as the emissive area EA and the transmissive area TA of the second sub pixel area B are disposed adjacent to the auxiliary electrode 1260 as depicted in FIG. 12.

In such cases, the emissive area EA of the first and second sub pixel areas A and B and their connection to the auxiliary electrode may be configured as the embodiments described along with FIGS. 3 through 6 showing the emissive area EA of the two sub pixels being adjacent to the auxiliary electrode. Likewise, the transmissive area TA of the first and second sub pixel areas A and B and their connection to the auxiliary electrode may be configured according to any of the embodiments described along with FIGS. 10 and 11 showing the transmissive area TA of the two sub pixels being adjacent to the auxiliary electrode.

Further, in the embodiments of the organic light emitting display device described in the present disclosure, at least two sub pixels are configured to share the auxiliary electrode formed therebetween. However, the auxiliary electro de needs not be disposed between each and every sub pixels. That is, two or more sub pixels may be disposed between the two adjacent auxiliary electrodes. In FIG. 12, two sub pixels in the same row are disposed between the two adjacent auxiliary electrodes 1260. When two sub pixels are disposed between the two adjacently disposed auxiliary electrodes, each of the sub pixels of the organic light emitting display device may be formed adjacent to one of the plurality of auxiliary electrode. Of course, additional number of sub pixels may be disposed between the two auxiliary electrodes 1260. As previously mentioned, the interval for placing the auxiliary electrode can be determined based on the surface electrical resistance of the cathode, the amount of electrical resistance offset by the auxiliary electrode as well as the overall light transmittance rate of the organic light emitting display device.

Figure 13A:
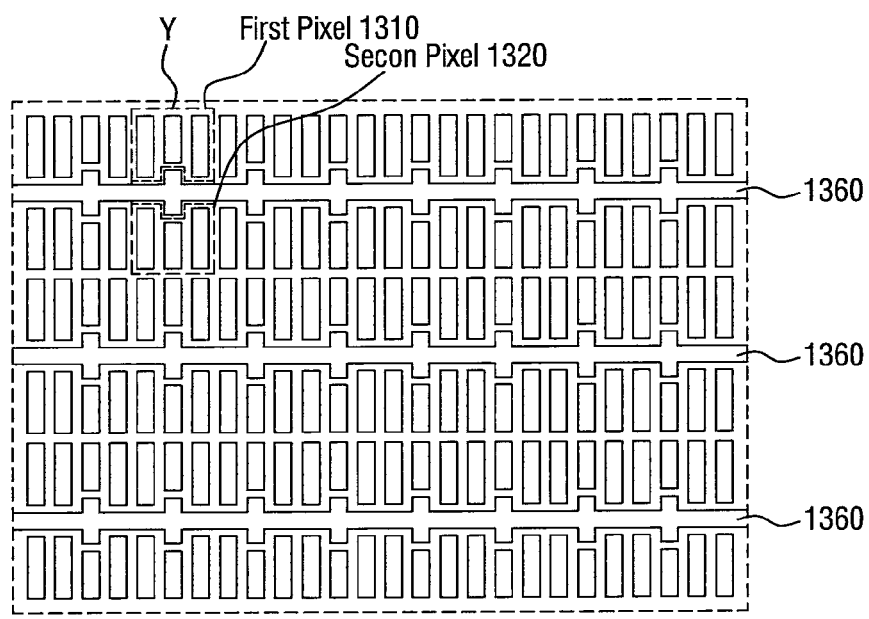
FIG. 13A is a conceptual diagram for describing an organic light emitting display device according to an exemplary embodiment.
Figure 13B:
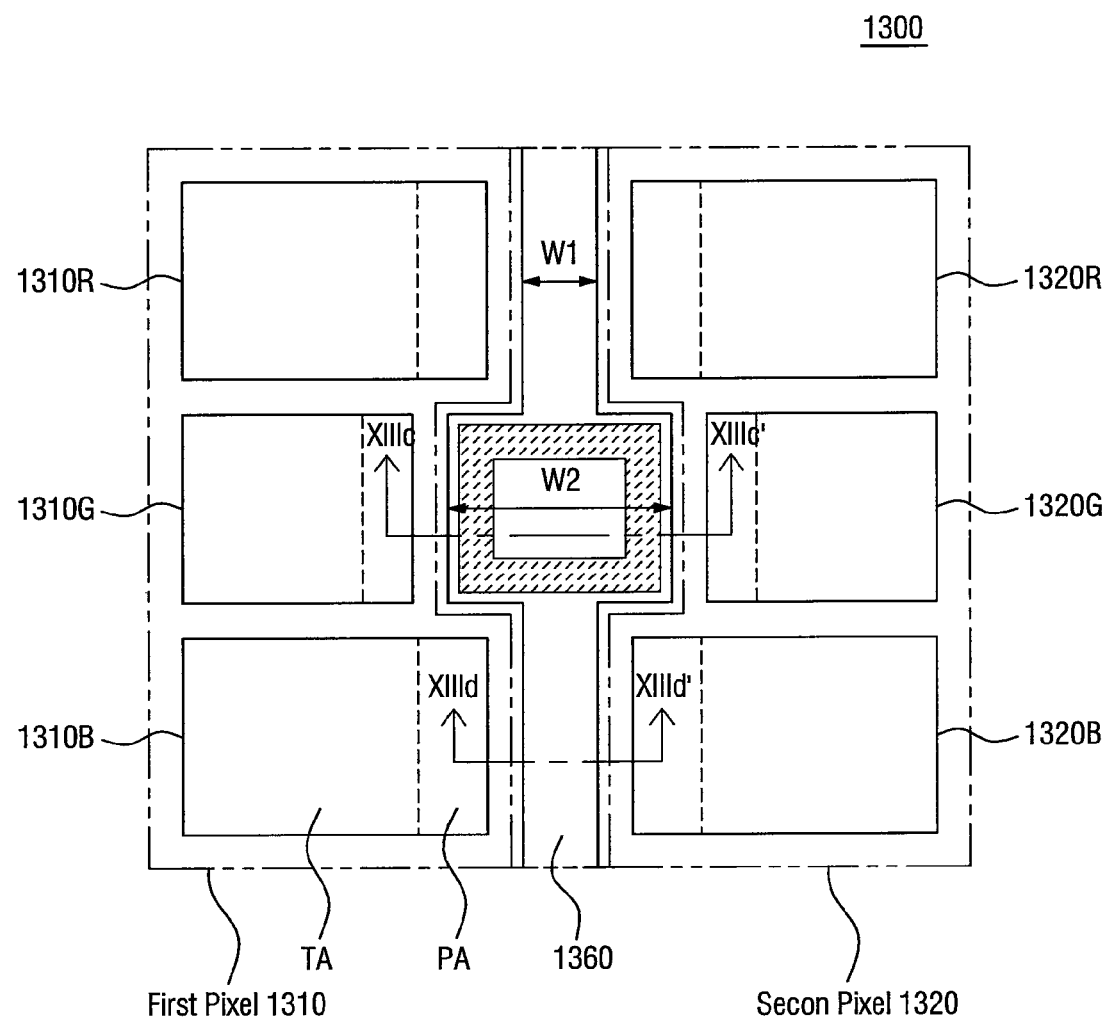
FIG. 13B is an enlarged diagram for an area Y of FIG. 13A.

FIG. 13A illustrates an exemplary pixel layout of an organic light emitting display device 1300 according to an embodiment of the present disclosure, and FIG. 13B is an enlarged view of the area Y of the organic light emitting display device 1300 depicted in FIG. 13A.

Referring to FIG. 13A, the organic light emitting display device 1300 includes a plurality of auxiliary electrodes 1360 arranged to extend in a first direction. A plurality of first pixels 1310 is arranged along one side of the auxiliary electrode 1360, and a plurality of second pixels 1320 is arranged in the opposite side of the auxiliary electrode 1360. The plurality of first pixels 1310 and the plurality of second pixels 1320 form a matrix of pixels, and each of the first and second pixels 1310 and 1320 is disposed next to only one auxiliary electrode 1360 of the plurality of auxiliary electrodes 1360. At least two pixels of the first and second pixels 1310 and 1320 are arranged in a second direction substantially perpendicular to the first direction of the auxiliary electrodes 1360.

Each of the first and second pixels 1310 and 1320 includes a set of sub pixels. In the exemplary embodiment shown in FIG. 13A, each of the first pixels 1310 and each of the second pixels 1320 includes three sub pixels. The first pixel 1310 and the second pixel 1320 are symmetrically disposed in reference to the auxiliary electrode 1360. Accordingly, the shape, the size, and the number of sub pixels of the first pixel 1310 are identical to those of the second pixel 1320.

Referring to FIG. 13B, the auxiliary electrode 1360 is extended in one direction on the substrate, and each of the first pixel 1310 includes a red sub pixel 1310R, a green sub pixel 1310G and a blue sub pixel 1310B, which are arranged along one side of the auxiliary electrode 1360. On the opposite side of the auxiliary electrode 1360, a red sub pixel 1320R, a green sub pixel 1320G and a blue sub pixel 1320B of the second pixel 1320 are arranged along the auxiliary electrode 1360. Each of the sub pixels are divided into an emissive area EA and a transmissive area TA. Since the first pixel 1310 and the second pixel 1320 mirrors each other, the layouts of the sub pixels within the first pixel 1310 and the second pixel 1320 are identical to each other. That is, the size and the placement order of the sub pixels as well as the proportion of the transmissive area TA and the emissive area EA of the sub pixels of the first pixel 1310 is identical to those of the second pixel 1320.

In the organic light emitting display device of the present invention, the cathode functions as a common electrode for all of the sub pixels, and thus, the physical contact between the cathode and the auxiliary electrode needs not be made for each and every sub pixels in the display device. Accordingly, in some embodiments, the physical contacts between the cathode and the auxiliary electrode are made selectively at certain sub pixels with a pixel. In other words, one or more sub pixels of a pixel can be configured to contact with the auxiliary electrode, while other pixel(s) is configured not to contact with the auxiliary electrode.

Figure 13C:
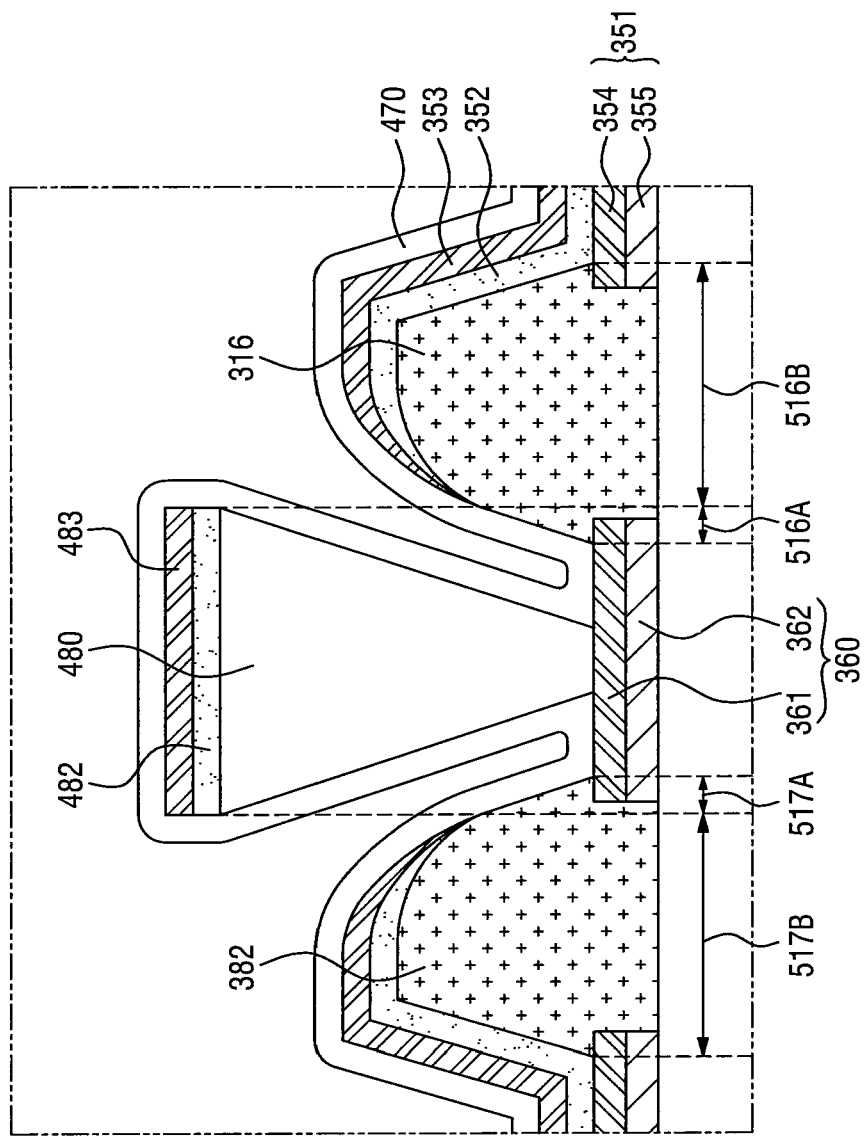
FIGS. 13C and 13D are cross-sectional enlarged diagrams for describing an organic light emitting display device according to an exemplary embodiment.

In the example shown in FIG. 13B, the green sub pixel 1310G of the first pixel 1310 and the green sub pixel 1320G of the second sub pixel 1320 are configured to contact the auxiliary electrode 1360, while the red sub pixels 1310R, 1320R and the blue sub pixels 1310B, 1320B are not in contact with the auxiliary electrode 1360. If the organic light emitting elements employed in the display device 1300 are white OLED type, the contact between the auxiliary electrode 360 and the cathodes of the green sub pixels 1310G and 1320G can be made as shown in FIG. 13C which is substantially the same as FIG. 5.

Figure 13D:
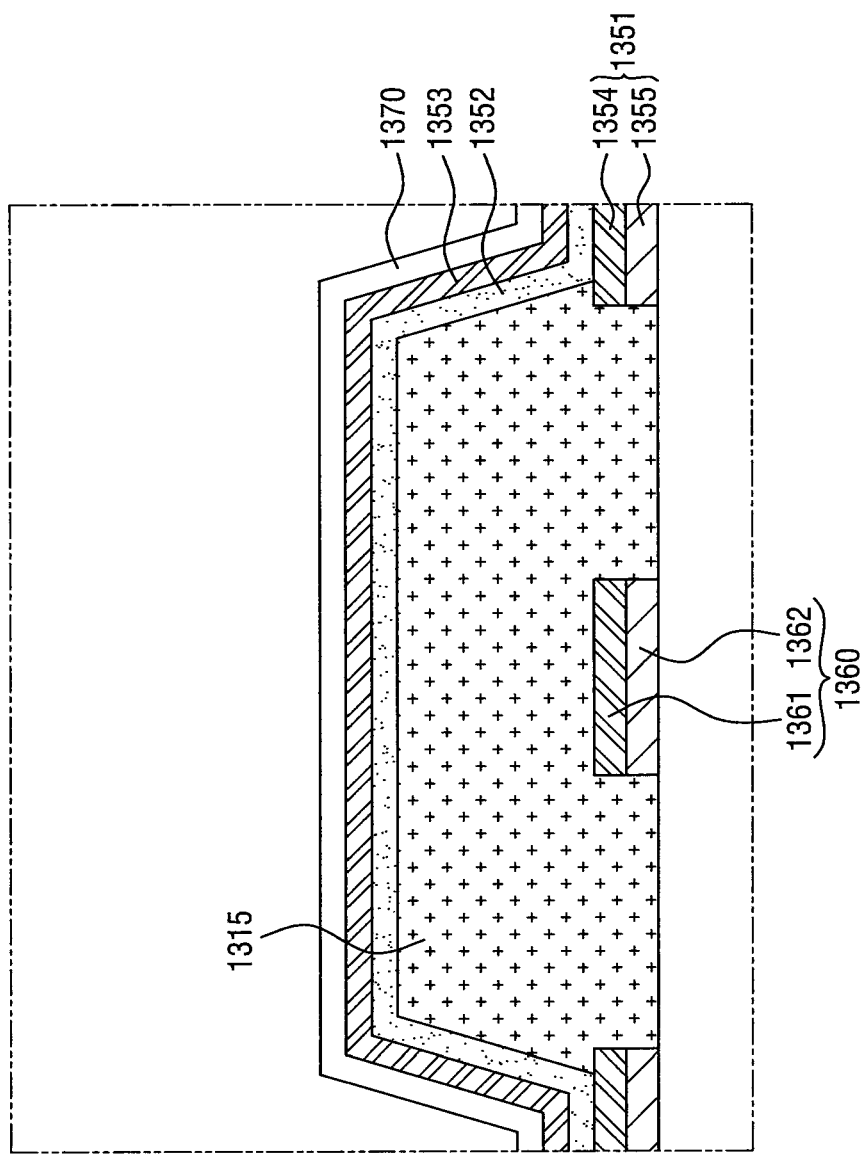

The part of the auxiliary electrode 360 that is not in contact with the adjacent sub pixels (i.e., red sub pixels, blue sub pixels) can be simply covered with the organic emission layer 352, the cathode 353 and transparent conductive layer 470. In some embodiments, the non-contacting part of the auxiliary elect rode 1360 may be covered with the bank 1315 before depositing the organic emission layer 352, the cathode 353 and transparent conductive layer 470 thereon, as shown in FIG. 13D.

Although the red sub pixels 1310R, 1320R and the blue sub pixels 1310B, 1320B do not contact the auxiliary electrode 1360, the cathodes of the green sub pixels 1310G, 1320G are connected with the cathodes of the red sub pixels 1310R, 1320R as well as cathodes of the blue sub pixels 1310B and 1310B. As such, the voltage drop at the first and second pixels 1310 and 1320 can be lessened even when the auxiliary electrode 1360 contacts only some of the selective sub pixels.

Limiting the number of sub pixels being in contact with the auxiliary electrode has yet another advantage for the organic light emitting display device 1300. Since the auxiliary electrode 1360 needs not be in contact with the cathodes of the red sub pixels 1310R and 1320R, the part of the auxiliary electrode 1360 between the red sub pixels 1310R and 1320R can have a narrower width "W1" than the part of the auxiliary electrode 1360 between the green sub pixels 1310G and 1320G with a broader width "W2" as depicted in FIG. 13B.

Like wise, the part of the auxiliary electrode 1360 between the blue sub pixels 1310B and 1320B can be narrower than the part of the auxiliary electrode 1360 between the green sub pixels 1310G and 1320G. Narrowing the parts of the auxiliary electrode 1360 results in larger room for the sub pixels adjacent to corresponding parts of the auxiliary electrode 1360. This, in turn, provides greater flexibility in pixel layout design. For instance, the sub pixels next to the narrower parts of the auxiliary electrode 1360 can have larger emissive area EA for better picture quality and/or larger transmissive area TA for better transparency.

In the exemplary embodiment of the organic light emitting display device 1300, the green sub pixels 1310G and 1320G are described as being in contact with the auxiliary electrode 1360. A green sub pixel is generally more efficient than other sub pixels in terms of luminance level. Even with smaller emissive area EA than other sub pixels, the luminance level at the green sub pixel can be similar to that of the red and blue sub pixels. Smaller emissive area EA, in turn, provides additional space for the wider part of the auxiliary electrode, ensuring proper contact between the cathode of the green sub pixels and the auxiliary electrode. Accordingly, it is preferred that the green sub pixels 1310G and 1320G to be the sub pixels for contacting the auxiliary electrode 1360. In some other embodiments, however, red and/or blue sub pixels may well be the sub pixels being in contact with the auxiliary electrode. Further, the sub pixels of the first pixel and the second pixel need not be the sub pixels of the same color.

In FIGS. 13A through 13D, the first and second pixels 1310 and 1320 of the organic light emitting display device 1300 are described and depicted as including three sub pixels with a rectangular shape for purposes of simpler explanation. However, it should be appreciated that the shape and the number of sub pixels in the first and second pixels 1310 and 1320 are not limited as such. In some other embodiments, pixels in the organic light emitting display device 1300 may include less or additional number of sub pixels. For example, each of the first and second pixels 1310 and 1320 may have four sub pixels, including red, green, blue and white sub pixels. Also, some or all of the sub pixels in the pixels 1310 and 1320, may be formed in a triangle or a square shape for more compact arrangement along the auxiliary electrode 1360.

While the sub pixels in the first and second pixels 1310 and 1320 are disposed in the order of red, green and blue, the order of the sub pixels along the auxiliary electrode 1360 is not limited to this particular order. Not all sub pixels of the first and second pixels 1310 and 1320 needs to be disposed along the auxiliary electrode 1360, but only some of the sub pixels of the first and second pixels 1310 and 1320 may be disposed along the same auxiliary electrode. Accordingly, in some embodiments, two sub pixels (e.g., red and green sub pixels) of a pixel can be positioned next to the auxiliary electrode, while other sub pixels (e.g., blue and white sub pixels) are positioned away from the auxiliary electrode next to the aforementioned first two sub pixels.

Figure 14:
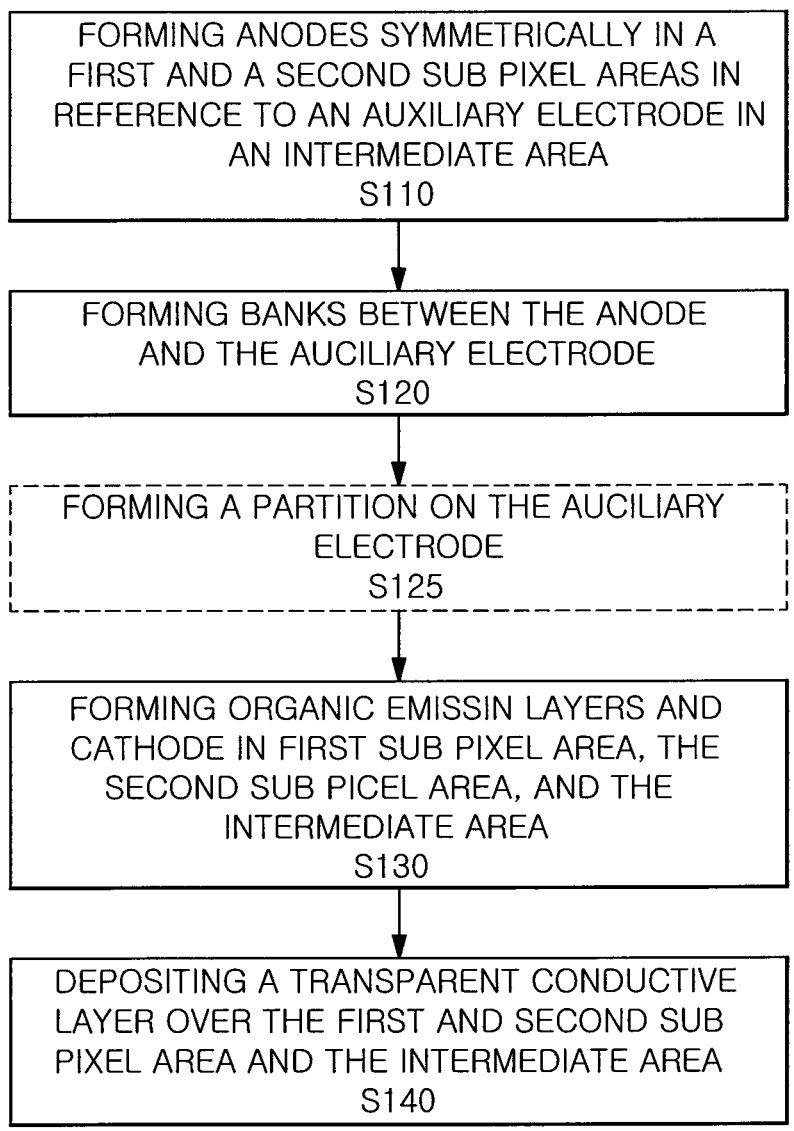
FIG. 14 is a flowchart illustrating a method for manufacturing an organic light emitting display device according to another embodiment.

FIG. 14 is a flowchart illustrating an exemplary method S100 for manufacturing an organic light emitting display device according to an embodiment of the present disclosure. In S110, anodes are symmetrically formed in a first sub pixel area A and a second sub pixel area B in reference to an auxiliary electrode is formed in the intermediate area C. The auxiliary electrode and the anodes may be formed on a same plane by depositing one or more conductive layers and patterning the conductive layer.

Figure 15A:
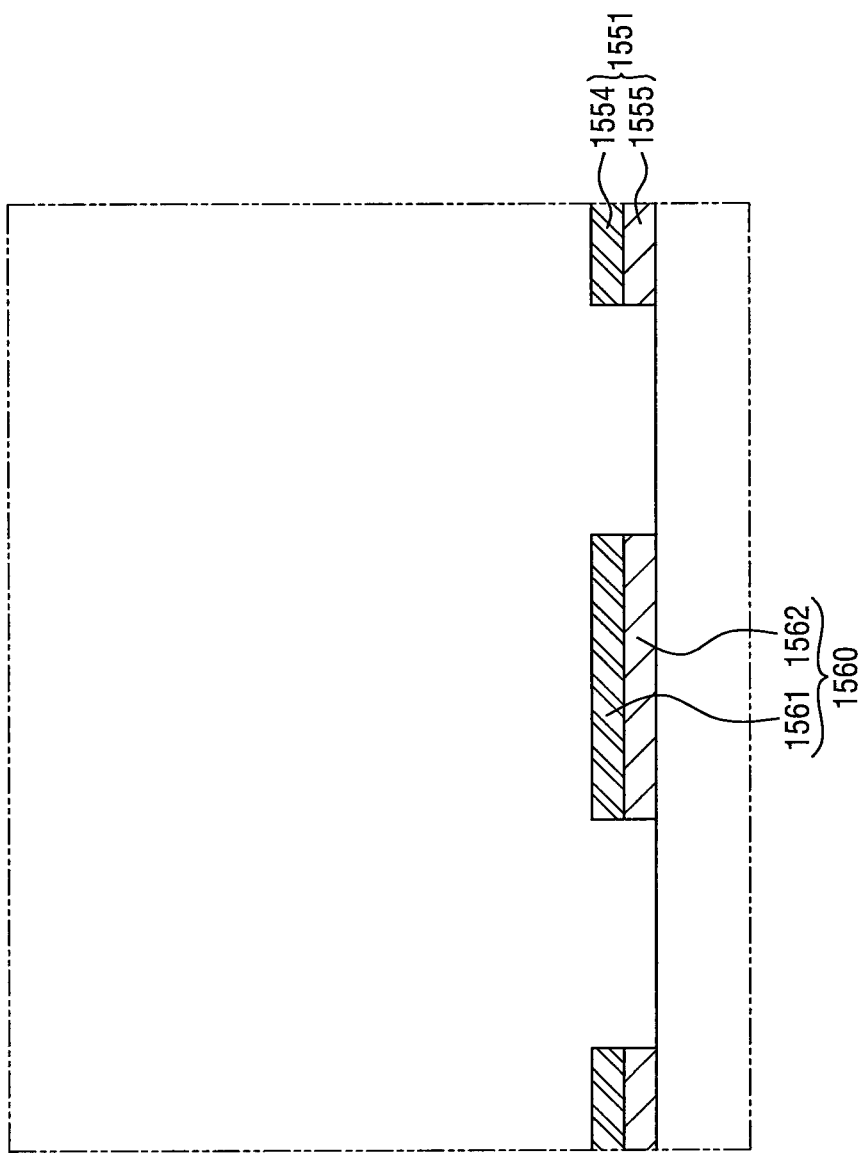
FIGS. 15A to 15F are cross-sectional views for each process for describing a method for manufacturing an organic light emitting display device according to another embodiment.

As shown in FIG. 15A, the auxiliary electrode 1560 is formed between the anodes 1551 on each side of the auxiliary electrode 1560, which are spaced apart from the auxiliary electrode 1560 by substantially the same distance. Further, the anodes 1551 are made of a stack of first conductive layer 1554 and a second conductive layer 1555. The first conductive layer may reflect light while the second conductive layer may be transparent. Accordingly, the first conductive layer may be formed of a material having increase light reflecting characteristic than the material forming the second conductive layer, and the second conductive layer 1555 of the anodes 1551 is formed of a transparent material.

The first and second conductive layers may be formed on the substrate, and patterned to form the anodes 1551 in the first and second sub pixel areas and the auxiliary electrode in the intermediate area C. In some embodiments, the first conductive layer may be formed only in the first and second sub pixels areas A and B, thereby resulting in an auxiliary electrode 1560 with only the second conductive layer 1562 in the intermediate area C. Alternatively, in some other embodiments, the second conductive layer 1555 is formed only in the first and second sub pixels areas A and B, thereby resulting in an auxiliary electrode 1560 with only the first conductive layer 1561 in the intermediate area C.

Figure 15B:
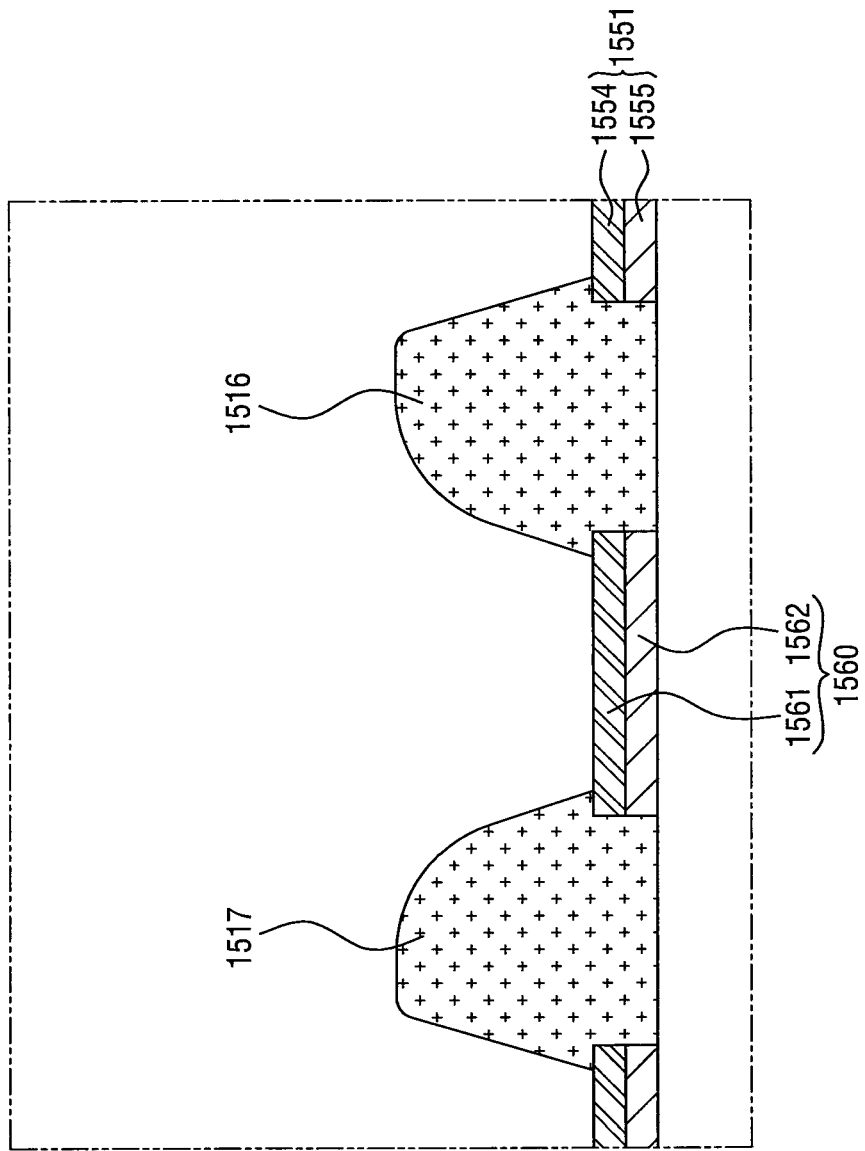

Referring back to FIG. 14, in S120, a first bank is formed between the anode in the first sub pixel area and one side of the auxiliary electrode, and a second bank is formed between the anode of the second sub pixel area and the other side of the auxiliary electrode. Referring to FIG. 15B, the first bank 1516 and the second bank 1517 are formed in a tapered shape. To form the first bank 1516 and the second bank 1517, a positive type photoresist may be coated on the substrate 1510, then partially exposed and developed into the tapered shape.

Referring back to FIG. 14, in S130, an organic emission layer and a cathode are formed on the first sub pixel area, the second sub pixel area, and the intermediate area. The organic emission layer and the cathode are formed by depositing an organic emission material and a cathode metallic material on the targeted part of the substrate. In case where the organic emission layer and the cathode are formed in the transmissive area TA, the light transmittance rate at the transmissive area TA may be reduced. Accordingly, the organic emission layer and the cathode may be formed only in the emissive area EA of the first and second sub pixels. However, the size of the emissive area EA and the close distance between the emissive areas EA in two sub pixels may make it very difficult to form the organic emission layer in each of the sub pixel areas by using a fine metal mask.

Figure 15C:
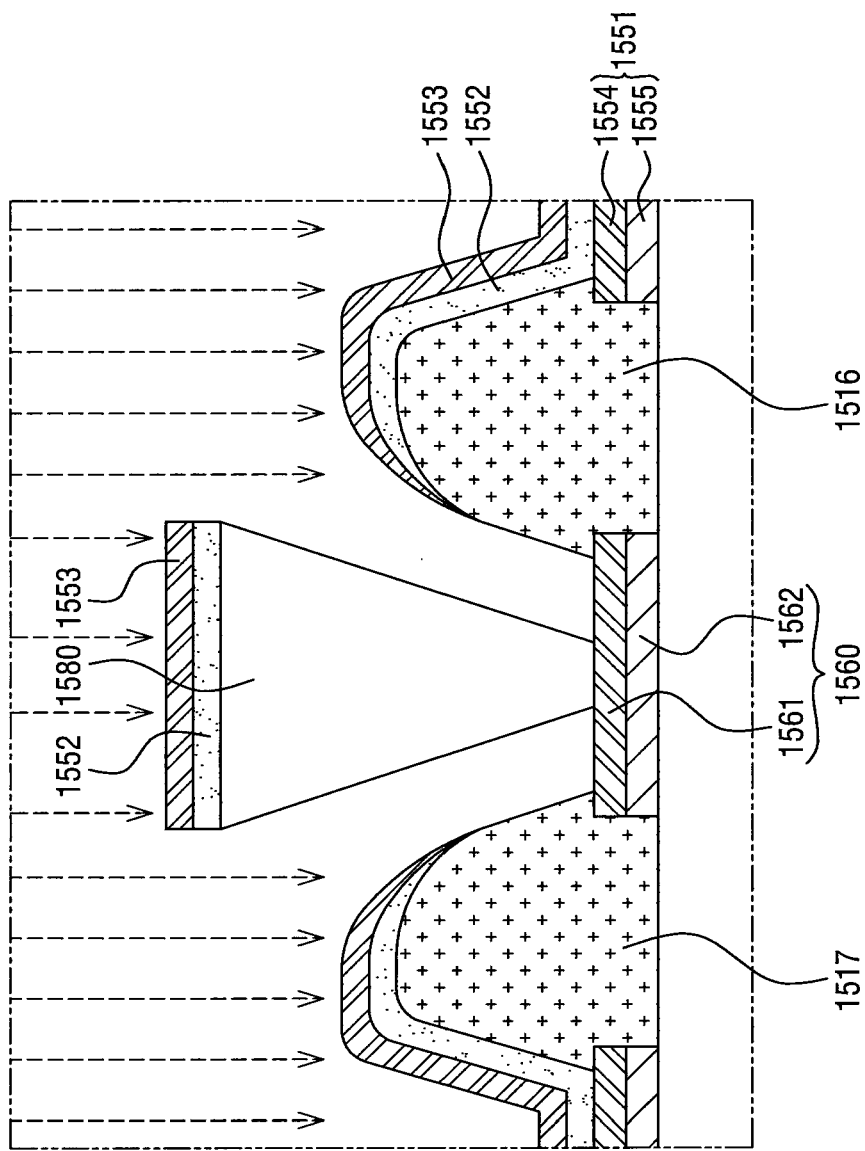
Figure 15D:
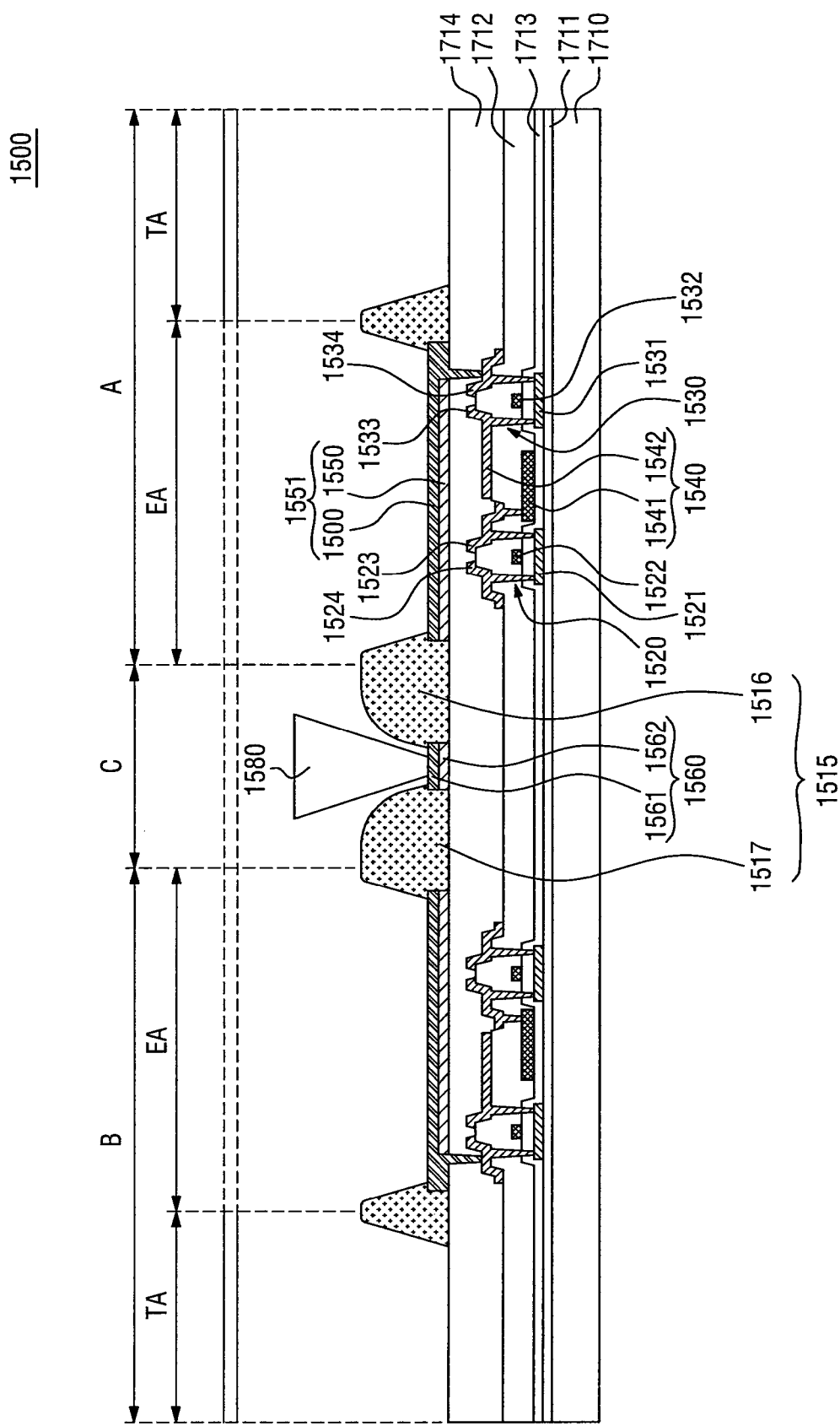
Figure 15E:
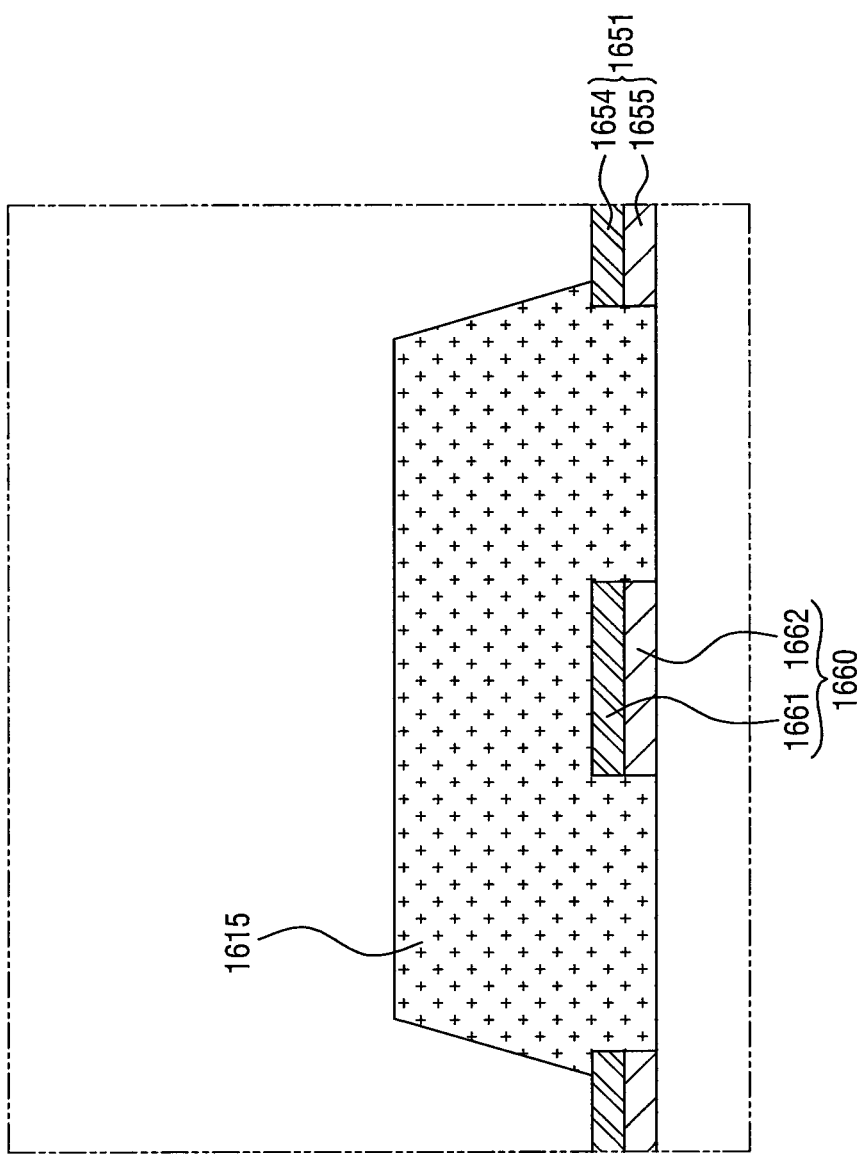

Accordingly, in some embodiments, a partition can be formed before forming the organic emission layer and the cathode. (S125) As shown in FIGS. 15C and 15D, the partition 1580 can be formed on the auxiliary electrode 1560 between the first and second bank 1516 and 1517. The partition 1580 may be formed in a reversely tapered shape by using a negative type photoresist. In the embodiments employing the partition 1580, the organic emission layer 1552 and the cathode 1553 may be deposited continuously from the first sub pixel area A, to the first bank 1516, to the partition 1580, to the second bank 1517, and to the second sub pixel area B as depicted in FIG. 15E. As described above, the shape of the partition 1580 exposes at least some portion of the auxiliary electrode 1560.

Referring back to FIG. 14, in S140, a transparent conductive layer is deposited over the first and second sub pixel area as well as the intermediate area C, thereby connecting the cathode of the first sub pixel area, the auxiliary electrode, and the cathode of the second sub pixel area.

Figure 15F:
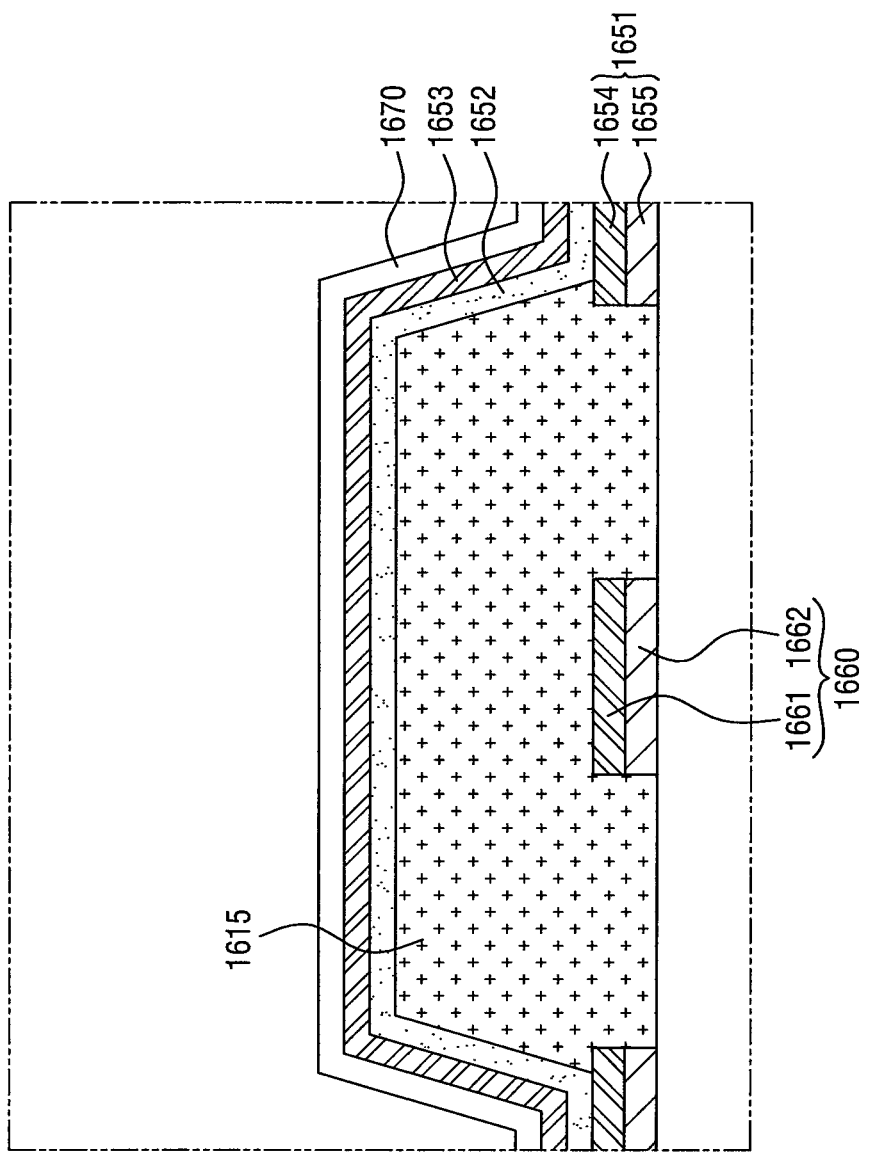

As shown in FIG. 15F, the transparent conductive layer 1570 is formed over the cathode 1553 and the partition 1580. The transparent conductive layer is generally formed of a transparent conductive oxide material having high step coverage, and thus, the transparent conductive layer 1570 can reach into the area between the banks and the partition. Accordingly, the transparent conductive layer 1570 electrically connects the cathode 1553 of the first sub pixel area A, the auxiliary electrode 1560, and the cathode 1553 of the second sub pixel area B. It should be noted that the transparent conductive layer can be formed over the first and second sub pixel areas and the intermediate area C even when the partition is not formed on the auxiliary electrode.

The exemplary embodiments of the present invention have been described in detail with reference to the accompanying drawings, but the present invention is not limited to the exemplary embodiments. It will be apparent to those skilled in the art that various modifications can be made without departing from the spirit of the invention.

What is claimed is:

1. A transparent organic light emitting display device, comprising:
    a plurality of sub pixels, each of the sub pixels including a first area associated with a first function of the sub-pixel and a second area associated with a second function of the sub-pixel; and
    a plurality of auxiliary electrodes electrically connected to the plurality of sub pixels via a conductive element, wherein the plurality of sub pixels include a first sub pixel and a second sub pixel, and
    wherein each of the auxiliary electrodes is disposed between the first sub-pixel and the second sub-pixel such that the auxiliary electrode is closer to the first area of the first sub-pixel and the first area of the second sub-pixel than the second area of the first sub-pixel and the second area of the second sub-pixel.

2. The transparent organic light emitting display device of claim 1, wherein the first function is to emit light for displaying of an image and the second function is to transmit external light.

3. The transparent organic light emitting display device of claim 2, wherein the first sub-pixel and the second sub-pixel each include an organic emission layer, the organic emission layer and the conductive element are not disposed in the second area of the first sub-pixel and the second sub-pixel.

4. The transparent organic light emitting display device of claim 1, further comprising:
    a partition disposed directly on some areas of the auxiliary electrode, other areas of the auxiliary electrode not directly contacted to the partition including an exposed remaining part of the auxiliary electrode; and
    wherein the conductive element includes a transparent conductive layer, a cathode of the first sub-pixel, and a cathode of the second sub-pixel, the transparent conductive layer covering the partition and in contact with the auxiliary electrode, the cathode of the first sub-pixel and the cathode of the second sub pixel.

5. The transparent organic light emitting display device of claim 4, further comprising:
    a plurality of banks including at least a first bank between an anode of the first sub pixel and the auxiliary electrode, and a second bank between an anode of the second sub pixel and the auxiliary electrode.

6. The transparent organic light emitting display device of claim 1, wherein the first function is to transmit external light and the second function is to emit light for displaying of an image.

7. The transparent organic light emitting display device of claim 6, wherein the conductive element includes a transparent conductive layer, a cathode of the first sub-pixel, and a cathode of the second sub-pixel, the transparent conductive layer covering the auxiliary electrode, the cathode of the first sub-pixel, and the cathode of the second sub pixel, wherein the cathode of the first sub-pixel and the cathode of the second sub-pixel are not disposed in the first area of the first sub-pixel and the first area of the second sub-pixel.

8. The transparent organic light emitting display device of claim 1, wherein the auxiliary electrode is made of a same material as an anode of the first sub-pixel and an anode of the second sub-pixel, the auxiliary electrode formed on a same plane as the anode of the first sub-pixel and the anode of the second sub-pixel on the substrate.

9. The transparent organic light emitting display device of claim 1, wherein the auxiliary electrode comprises a first conductive layer including a transparent material formed on a second conductive layer including a reflective material or the auxiliary comprises the second conductive layer.

10. A transparent organic light emitting display device, comprising:
    a plurality of sub pixels, each of the sub pixels including an emissive area and a transmissive area; and
    a plurality of auxiliary electrodes electrically connected to a respective conductive element in each of the sub pixels, wherein said sub pixels include a first sub pixel and a second sub pixel that are symmetrically arranged to each other relative to the auxiliary electrode.

11. The transparent organic light emitting display device of claim 10, wherein each of the auxiliary electrodes is disposed between the first sub-pixel and the second sub-pixel such that the auxiliary electrode is closer to an emissive area of the first sub-pixel and an emissive area of the second sub-pixel than a transmissive area of the first sub-pixel and a transmissive area of the second sub-pixel.

12. The transparent organic light emitting display device of claim 10, wherein each of the auxiliary electrodes is disposed between the first sub-pixel and the second sub-pixel such that the auxiliary electrode is closer to a transmissive area of the first sub-pixel and a transmissive area of the second sub-pixel than an emissive area of the first sub-pixel and an emissive area of the second sub-pixel.

13. The transparent organic light emitting display device of claim 10, wherein the plurality of auxiliary electrodes is arranged to extend in a first direction, and wherein at least two sub pixels are disposed between two adjacent auxiliary electrodes in which said at least two sub pixels are arranged in a second direction substantially perpendicular to the first direction.

14. A transparent organic light emitting display device, comprising:
    an auxiliary electrode including a first side and a second side, the auxiliary electrode extending in a first direction; and
    a first pixel including a first plurality of sub-pixels disposed on the first side of the auxiliary electrode;
    a second pixel including a second plurality of sub-pixels disposed on the second side of the auxiliary electrode;
    wherein at least one of the first plurality of sub-pixels of the first pixel is connected to the auxiliary electrode and at least one of the second plurality of sub-pixels of the second pixel is connected to the auxiliary electrode; and
    wherein at least one of the first plurality of sub-pixels of the first pixel is not connected to the auxiliary electrode and at least one of the second plurality of sub-pixels of the second pixel is not connected to the auxiliary electrode.

15. The transparent organic light emitting display device of claim 14, wherein:

the first plurality of sub-pixels each include a first area associated with a first function and a second area associated with a second function; and the second plurality of pixels each include a first area associated with the first function and a second area associated with the second function.

16. The transparent organic light emitting display device of claim 15, wherein a portion of the auxiliary electrode in contact with the at least one sub pixel of the first pixel and the at least one sub-pixel of the second pixel is larger than other portions of the auxiliary electrode not in contact with one sub-pixel of the first pixel and one sub-pixel of the second pixel.

17. The transparent organic light emitting display device of claim 15, wherein the at least one of the first plurality of sub-pixels connected to the auxiliary electrode and the at least one of the second plurality of sub-pixels connected to the auxiliary electrode emit light of a same color.

18. The transparent organic light emitting display device of claim 17, wherein the light of the same color is green.

19. The transparent organic light emitting display device of claim 14, wherein the at least one sub pixel of the first pixel that is in contact with the auxiliary electrode is smaller in size than the other first plurality of sub-pixels that are not in contact with the auxiliary electrode and the at least one sub pixel of the second pixel that is in contact with the auxiliary electrode is smaller in size than the other second plurality of sub-pixels that are not in contact with the auxiliary electrode.

20. The transparent organic light emitting display device of claim 14, further comprising:

a partition disposed on the auxiliary electrode between the one of the first plurality of sub-pixels connected to the auxiliary electrode and the one of the second plurality of sub-pixels connected to the auxiliary electrode; and a conductive element covered over the partition, the at least one of the first plurality of sub-pixels of the first pixel and the at least one of the second plurality of sub-pixels of the second pixel connected to the auxiliary electrode via the conductive element.

* * * * *